United States Patent
Bertin et al.

(10) Patent No.: US 9,852,793 B2
(45) Date of Patent: *Dec. 26, 2017

(54) METHODS FOR PROGRAMMING AND ACCESSING DDR COMPATIBLE RESISTIVE CHANGE ELEMENT ARRAYS

(71) Applicant: Nantero Inc., Woburn, MA (US)

(72) Inventors: Claude L. Bertin, Venice, FL (US); Glen Rosendale, Palo Alto, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/191,277

(22) Filed: Jun. 23, 2016

(65) Prior Publication Data
US 2017/0032839 A1    Feb. 2, 2017

Related U.S. Application Data

(63) Continuation of application No. 14/812,173, filed on Jul. 29, 2015, now Pat. No. 9,412,447.

(51) Int. Cl.
*G11C 11/00* (2006.01)
*G11C 13/00* (2006.01)
(Continued)

(52) U.S. Cl.
CPC .......... *G11C 13/0069* (2013.01); *B82Y 10/00* (2013.01); *G11C 13/004* (2013.01);
(Continued)

(58) Field of Classification Search
CPC .............. G11C 13/0069; G11C 13/004; G11C 13/0004
(Continued)

(56) References Cited

U.S. PATENT DOCUMENTS 6,422,450 B1    7/2002  Zhou et al.
6,423,583 B1    7/2002  Avouris et al.
(Continued)

OTHER PUBLICATIONS

Amblard, G., "Development and characterization of carbon nanotube processes for NRAM technology," Proc. of SPIE 2011, vol. 7970, pp. 797017-1-797017-7.
(Continued)

*Primary Examiner* — Pho M Luu
(74) *Attorney, Agent, or Firm* — Nantero, Inc.

(57) ABSTRACT

A high-speed memory circuit architecture for arrays of resistive change elements is disclosed. An array of resistive change elements is organized into rows and columns, with each column serviced by a word line and each row serviced by two bit lines. Each row of resistive change elements includes a pair of reference elements and a sense amplifier. The reference elements are resistive components with electrical resistance values between the resistance corresponding to a SET condition and the resistance corresponding to a RESET condition within the resistive change elements being used in the array. A high speed READ operation is performed by discharging one of a row's bit lines through a resistive change element selected by a word line and simultaneously discharging the other of the row's bit lines through of the reference elements and comparing the rate of discharge on the two lines using the row's sense amplifier. Storage state data are transmitted to an output data bus as high speed synchronized data pulses. High speed data is received from an external synchronized data bus and stored by a PROGRAM operation within resistive change elements in a memory array configuration.

24 Claims, 14 Drawing Sheets

(51) Int. Cl.
  *B82Y 10/00* (2011.01)
  *G11C 13/02* (2006.01)
  *G11C 23/00* (2006.01)
  *G11C 29/02* (2006.01)
  *H03K 19/177* (2006.01)

(52) U.S. Cl.
  CPC ...... *G11C 13/0004* (2013.01); *G11C 13/0007* (2013.01); *G11C 13/0061* (2013.01); *G11C 13/025* (2013.01); *G11C 23/00* (2013.01); *G11C 29/02* (2013.01); *G11C 29/021* (2013.01); *G11C 29/023* (2013.01); *G11C 29/028* (2013.01); *H03K 19/1776* (2013.01); *H03K 19/1778* (2013.01); *H03K 19/17728* (2013.01); *H03K 19/17736* (2013.01); *H03K 19/17796* (2013.01); *G11C 2013/0042* (2013.01); *G11C 2013/0054* (2013.01); *G11C 2213/35* (2013.01); *G11C 2213/82* (2013.01); *Y10S 977/94* (2013.01)

(58) Field of Classification Search
  USPC ........................................................ 365/148
  See application file for complete search history.

(56) References Cited

U.S. PATENT DOCUMENTS

| | | | |
|---|---|---|---|
| 6,528,020 | B1 | 3/2003 | Dai et al. |
| 6,706,402 | B2 | 3/2004 | Rueckes et al. |
| 6,808,746 | B1 | 10/2004 | Dai et al. |
| 6,835,591 | B2 | 12/2004 | Rueckes et al. |
| 6,894,359 | B2 | 5/2005 | Bradley et al. |
| 6,899,945 | B2 | 5/2005 | Smalley et al. |
| 6,918,284 | B2 | 7/2005 | Snow et al. |
| 6,919,740 | B2 | 7/2005 | Snider et al. |
| 6,921,575 | B2 | 7/2005 | Horiuchi et al. |
| 7,015,500 | B2 | 3/2006 | Choi et al. |
| 7,115,901 | B2 | 10/2006 | Bertin et al. |
| 7,161,403 | B2 | 1/2007 | Bertin et al. |
| 7,335,395 | B2 | 2/2008 | Ward et al. |
| 7,365,632 | B2 | 4/2008 | Bertin et al. |
| 7,479,654 | B2 | 1/2009 | Bertin et al. |
| 7,781,862 | B2 | 8/2010 | Bertin et al. |
| 7,835,170 | B2 | 11/2010 | Bertin et al. |
| 8,000,127 | B2 | 8/2011 | Hamilton |
| 8,008,745 | B2 | 8/2011 | Bertin et al. |
| 8,013,363 | B2 | 9/2011 | Bertin et al. |
| 8,217,490 | B2 | 7/2012 | Bertin et al. |
| 8,351,239 | B2 | 1/2013 | Kim et al. |
| 8,619,450 | B2 * | 12/2013 | Hamilton ............... B82Y 10/00 365/100 |
| 9,263,126 | B1 * | 2/2016 | Viviani ................. G11C 13/004 |
| 9,299,430 | B1 * | 3/2016 | Bertin ................. G11C 13/0069 |
| 9,412,447 | B1 * | 8/2016 | Bertin .................... B82Y 10/00 |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates et al. |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2008/0157126 | A1 | 7/2008 | Bertin et al. |

OTHER PUBLICATIONS

Avouris, P., "Carbon nanotube electronics," Chemical Physics, 2002, vol. 281, pp. 429-445.
Brock, et al., "Carbon Nanotube Memories and Fabrics in a Radiation Hard Semiconductor Foundry," 2005 IEEE Conference, 9 pgs.
Brown, K. M., "System in package "The Rebirth of SIP"," 2004 IEEE Custom Integrated Circuits, May 2004, 6 pgs.
Collins, et al., "Engineering Carbon Nanotubes and Nanotube Circuits Using Electrical Breakdown," Science, 2001, vol. 292, pp. 706-709.
Crowley, et al., "512 Mb PROM with 8 layers of antifuse/Diode cells," IEEE International Solid-State Circuits Conference, vol. XLVI, Feb. 2003, pp. 284-285.
Dercke, et al., "Carbon Nanotube Inter—and Intramolecular Logic Gates," Nano Letters, Sep. 2001, vol. 1, No. 9, pp. 453-456.
Hone, J. "Phonons and Thermal Properties of Carbon Nanotubes," Topics Appl. Phys., 2001, vol. 80, pp. 273-286.
Huai, Y., "Spin-Transfet Torque MRAM (STT-MTAM): Challenges and Prospects," AAPS Bulletin, vol. 18, No. 6, Dec. 2008, pp. 33-40.
Jiang, et al., "Performance Breakthrough in 8nm Gate-All-Around Length Gate-All Around Nanowire Transistors using Metallic Nanowire Contacts," 2008 Symposium on VLSI Technology Digest of Technical Papers, pp. 34-35.
Johnson, R.C., "IBM fellow unrolls blueprint for nano," EE Times, 3 pgs., Mar. 6, 2006, http://www.eetimes.com/show/Article.ihtml?.ArticleID=181500304.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Quantum Interference and Ballistic Transmission in Nanotube Electron Wavegrinders," The American Physical Society, 2001, vol. 87, No. 10, pp. 106801-1-106801-4.
Langer, et al., Electrical resistance of a carbon nanotube bundle, J. Mater. Res., vol. 9, No. 4, Apr. 1994, pp. 927-932.
Onoa, et al., "Bulk production of singly dispersed carbon nanotubes with prescribed lengths," Nanotechnology, 2005, vol. 16, pp. 2799-2803.
Langer, et al., "Electrical resistance of a carbon nanotube bundle," J. Mater. Res., 1994, vol. 9, No. 4, pp. 927-932.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, Jul. 2000, vol. 289, pp. 94-97.
Servalli, G., "A 45nm Generation Phase Change Memory Technology," IEDM 2009 Technical Digest, pp. 5.7.1-5.7.4.
Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.
Ward, et al., "A Non-Volatile Nanoelectromechanical Memory Element Utilizing a Fabric of Carbon Nanotubes," IEEE 2004, pp. 34-38.

* cited by examiner

|         | RESET      | SET        | READ       |
|---------|------------|------------|------------|
| WL[0]   | $V_{PP}$   | $V_{PP}$   | $V_{PP}$   |
| BL[0]   | $V_{RST}$  | 0V         | 0V         |
| SL[0]   | 0V         | $V_{SET}$  | $V_{RD}$   |
| WL[1:y] | 0V         | 0V         | 0V         |
| BL[1:x] | Z          | Z          | Z          |
| SL[1:x] | Z          | Z          | Z          |

| Function # | Function Name | Read Operation | Write Operation |
|---|---|---|---|
| 410 | Memory Array | Active; $V_{DD}$ | Active; $V_{HI}$ |
| 412 | Reference Resistors | Active; $V_{DD}$ | Inactive |
| 420 | Equilibration; Isolation | Active;* $V_{DD}$ | Active;* $V_{HI}$ |
| 430 | Sense Amplifier / Latch | Active; $V_{DD}$ | Active; $V_{HI}$ |
| 440 | Data Bus Bi-directional Control | Active; $V_{DD}$ | Active; $V_{HI}$ |

*Isolation devices are turned ON connecting sense amplifier/latch 630 and memory array 610

| Function # | Function Name | Read Operation | Write Operation |
|---|---|---|---|
| 610 | Memory Array | Active; $V_{DD}$ | Active; $V_{HI}$ |
| 612 | Reference Resistors | Active; $V_{DD}$ | Inactive |
| 615 | Write Select | Inactive | Active; $V_{HI}$ |
| 620 | Equilibration; Isolation | Active;* $V_{DD}$ | Inactive+ |
| 625 | Voltage Shifter | Inactive | Active; $V_{HI}$ |
| 630 | Sense Amplifier / Latch | Active; $V_{DD}$ | Active; $V_{DD}$ |
| 640 | Data Bus Bi-directional Control | Active; $V_{DD}$ | Active; $V_{DD}$ |

\* Isolation devices are turned ON connecting sense amplifier/latch 630 and memory array 610

+ Isolation devices are turned OFF disconnecting sense amplifier/latch 630 and memory array 610

FIG. 6A

METHODS FOR PROGRAMMING AND ACCESSING DDR COMPATIBLE RESISTIVE CHANGE ELEMENT ARRAYS

This application is a continuation of U.S. patent application No. 9,412,447, filed on Jul. 29, 2015, entitled DDR Compatible Memory Circuit Architecture for Resistive Change Element Arrays.

CROSS-REFERENCE TO RELATED APPLICATIONS

This application is related to the following U.S. patents, which are assigned to the assignee of the present application, and are hereby incorporated by reference in their entirety:

U.S. Pat. No. 6,835,591, filed on Apr. 23, 2002, entitled Methods of Nanotube Films and Articles;

U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;

U.S. Pat. No. 6,706,402, filed on Mar. 16, 2004, entitled Nanotube Films and Articles;

U.S. Pat. No. 7,115,901, filed on Jun. 9, 2004, entitled Non-Volatile Electromechanical Field Effect Devices and Circuits Using Same and Methods of Forming Same; and U.S. Pat. No. 7,365,632, filed on Sep. 20, 2005, entitled Resistive Elements Using Carbon Nanotubes.

U.S. Pat. No. 7,781,862, filed on Nov. 15, 2005, entitled Two-Terminal Nanotube Devices and Systems and Methods of Making Same;

U.S. Pat. No. 7,479,654, filed on Nov. 15, 2005, entitled Memory Arrays Using Nanotube Articles with Reprogrammable Resistance;

U.S. Pat. No. 8,217,490, filed on Aug. 8, 2008, entitled Nonvolatile Nanotube Diodes and Nonvolatile Nanotube Blocks and Systems Using Same and Methods of Making Same;

U.S. Pat. No. 8,351,239, filed on Oct. 23, 2009, entitled Dynamic Sense Current Supply Circuit and Associated Method for Reading and Characterizing a Resistive Memory Array; and U.S. Pat. No. 8,000,127, filed on Nov. 13, 2009, entitled Method for Resetting a Resistive Change Memory Element.

This application is related to the following U.S. patent applications, which are assigned to the assignee of the application, and are hereby incorporated by reference in their entirety:

U.S. patent application Ser. No. 12/536,803, filed on Aug. 6, 2009, entitled Nonvolatile Nanotube Programmable Logic Devices and a Nonvolatile Nanotube Field Programmable Gate Array Using Same; and U.S. patent application Ser. No. 12/873,946, filed on Sep. 1, 2010, entitled A Method for Adjusting a Resistive Change Element Using a Reference.

TECHNICAL FIELD

The present disclosure relates generally to circuit architecture for resistive change element memory arrays, and, more specifically, to such architectures with digital chip interfaces that are similar to double data rate (DDR) memory interfaces.

BACKGROUND OF THE INVENTION

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor and electronics industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store four bits of data. Or a resistive change element might be arranged to switch between $2^n$ resistive states, so as to store n bits of data.

Within the current state of the art, there is an increasing need to implement resistive change memory arrays into architectures compatible with existing technology. In this way, the advantages of resistive change memory can be realized in circuits and systems using conventional silicon based microprocessors, microcontrollers, FPGAs, and the like. For example, a number of circuit architectures (such as, but not limited to, those taught by the incorporated references) have been introduced that provide resistive change memory arrays and architectures that are compatible with existing non-volatile flash memory architectures. As the popularity and cost and design advantages of resistive change element memories increases, there is a growing need to provide higher speed and lower power circuit architectures for resistive change memory arrays to further increase the versatility of resistive change memory technology. To this end, it would be advantageous to provide a DDR compatible architecture for a resistive change element memory array.

SUMMARY OF THE INVENTION

The present disclosure relates to circuit architectures for arrays of resistive change elements and, more specifically, to such architectures with digital chip interfaces that are similar to the speed and power requirements of conventional double data rate (DDR) architectures.

In particular, the present disclosure provides a resistive change element memory array. This resistive change element array comprises a plurality of word lines, a plurality of bit lines, a plurality of select lines, and a plurality of memory cells.

The memory cells within the resistive change array each comprise a resistive change element having a first terminal and a second terminal. The first terminal of the resistive change element is in electrical communication with a select line, and the resistive change element is capable of being switched between at least two non-volatile resistance values wherein a first resistance value corresponds to a first informational state and a second resistance value corresponds to a second informational state. The memory cells within the array also each comprise a selection device. These selection devices are each responsive to a control signal on a word line, and each selection device selectively provides a conductive path between a bit line and the second terminal of the resistive change element with its memory cell.

The resistive change element array also comprises a plurality of reference elements. These reference elements each comprise a resistive reference element having a first terminal and a second terminal. The first terminal of each resistive reference element being in electrical communication with a bit line, and wherein each resistive reference element has an electrical resistance selected to fall between the resistance corresponding to a first informational state in the resistive change elements and the resistance value corresponding to a second informational state within the resistive change elements. The resistive change element array also comprises a selection device responsive to a control signal on a word line. These selection devices selectively provide a conductive path between a bit line and the second terminal of the resistive reference element within its memory cell.

The resistive change element array also comprises a plurality of sense amplifiers. Each of these sense amplifiers is responsive to at least one bit line electrically coupled to a resistive change element and at least one bit line electrically coupled to a resistive reference element. At least one of said plurality of sense amplifiers can be used to compare the rate of discharge on a bit line electrically coupled to a resistive change element that has been selected by a word line and the rate of discharge on a bit line electrically coupled to a resistive reference element selected by a word line, and that comparison is used to READ the informational state of a selected memory cell.

The present disclosure also provides a method for reading the informational state of a resistive change element. The method comprises providing a resistive change element, wherein the resistive change element is capable of being switched between at least two non-volatile resistance values with a first resistance value corresponding to a first informational state and a second resistance value corresponding to a second informational state. The method further comprises providing a resistive reference element, wherein the resistive reference element has an electrical resistance selected to fall between the resistance corresponding to a first informational state in the resistive change elements and the resistance value corresponding to a second informational state within the resistive change elements. The method further comprises discharging a voltage through both the resistive change element and the resistive reference element. The method further comprises comparing the rate of discharge through said resistive change element to the rate of discharge through said resistive reference element. Within this method, a greater rate of discharge through said resistive change element corresponds to a first informational state being stored within the resistive change element and a greater rate of discharge through the resistive reference element corresponds to a second informational state being stored within the resistive change element.

According to one aspect of the present disclosure a resistive change element is a two-terminal nanotube switching element comprising a nanotube fabric.

According to another aspect of the present disclosure a resistive change element is a metal oxide memory element.

According to another aspect of the present disclosure a resistive change element is a phase change memory element.

According to another aspect of the present disclosure a resistive change memory array compatible with a double data rate (DDR) memory architecture is provided.

Other features and advantages of the present disclosure will become apparent from the following description of the invention which is provided below in relation to the accompanying drawings.

BRIEF DESCRIPTION OF THE DRAWINGS

FIG. 3B is table detailing READ and programming voltages required for adjusting or inspecting CELL00 of the array architecture illustrated in FIG. 3A.

FIG. 4A is table listing the different sections of a first DDR compatible NRAM architecture (as detailed in FIG. 4B) according to the methods of the present disclosure.

FIG. 6A is table listing the different sections of a second DDR compatible NRAM architecture (as detailed in FIG. 6B) according to the methods of the present disclosure.

DETAILED DESCRIPTION

Figure 1:
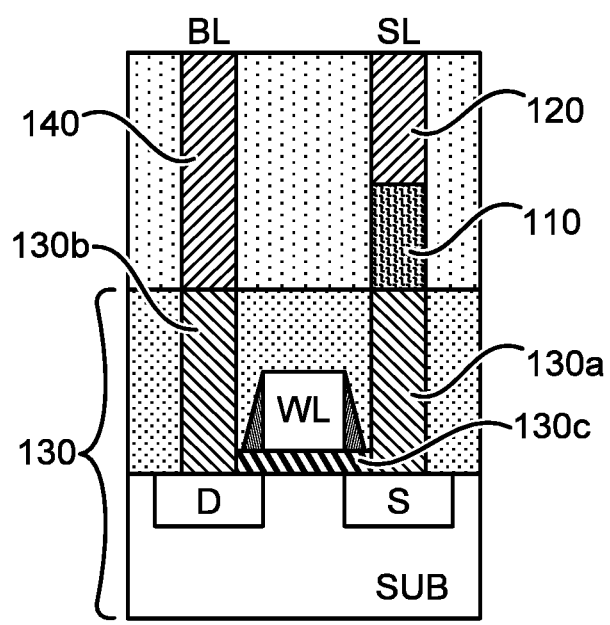
FIG. 1 illustrates an exemplary layout of a vertically oriented resistive change cell.

The present disclosure relates to advanced circuit architectures for arrays of resistive change elements. More specifically, the present disclosure teaches memory array architectures for resistive change elements with digital chip interfaces that are similar to a double data rate (DDR) interface. DDR interfaces may be used in DRAMs, SRAMs, NRAM™s and other volatile and nonvolatile type memories. While memory cells built using resistive change memory elements offer numerous advantages over those comprising conventional silicon based memory devices, timing and power requirements for programming and reading resistive change memory elements can represent limitations within certain applications. The circuit architecture of the present disclosure provides a memory array that can be rapidly accessed (READ) and requires relatively low power for reading and programming operations thereby overcoming these limitations.

Within the circuit architecture of the present disclosure, a plurality of resistive change elements is arranged into an array of rows and columns. Each column of resistive change elements is accessed via a word line, and each row of resistive change elements is responsive to a pair of bits lines and a select line. It should be noted that word lines and bit lines in some schematics are shown a columns (vertical "y" orientation) and rows (horizontal "x" orientation), respectively, for reasons illustrative convenience. However, word and bit lines may also be shown with row horizontal "x" and column vertical "y" orientations, respectively. The resistive change elements within each row are arranged in a folded bit line arrangement for purposes of common capacitive coupled noise rejection by the differential sense amplifier/latch connected to the bit line pairs (explained in more detail below with respect to FIGS. 4B and 5B). During a READ operation, this folded bit line arrangement allows a first bit line to discharge through the resistive change element within a selected cell while a second bit line discharges simultaneously through a reference element. A sense amplifier/latch compares the discharge rates of both bit lines (that is, the selected cell's bit line and the reference element's bit line) and temporarily stores the data value of the selected cell. This data value can then be READ out of the array through a decoding and buffering element at a desired clock cycle. While resistive change elements are non-volatile, and therefore READ operations are typically non-destructive (that is, reading or sensing the informational state of a resistive change element does not alter or disturb the state stored in that element) the circuit architecture of the present disclosure also provides a method for resetting (a RESET WRITE operation) resistive change elements in a selected sub-array during the READ out cycle for higher speed and lower power operation. This resetting operation can be used, as desired, to provide additional flexibility in achieving compatibility with a conventional DDR reading cycle. This RESET operation at the end of the READ cycle is used primarily in a page mode operation in which a page of memory data is READ followed by a page of new data written in its place. The terms program and WRITE are used interchangeably in this application.

Resistive change cells store information through the use of a resistive change element within the cell. Responsive to electrical stimuli, a resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change element cell can be used to a store a bit of information (functioning, for example, as a 1-bit memory element). According to other aspects of the present disclosure, more than two resistive states may be used, allowing a single cell to store more than one bit of information. For example, a resistive change memory cell might adjust its resistive change element between four non-volatile resistive states, allowing for the storage of two bits of information in a single cell.

Within the present disclosure the term "programming" is used to describe an operation wherein a resistive change element is adjusted from an initial resistive state to a new desired resistive state. Such programming operations can include a SET operation, wherein a resistive change element is adjusted from a relatively high resistive state (e.g., on the order of 2 MΩ) to a relatively low resistive state (e.g., on the order of 100 kΩ). Such programming operations (as defined by the present disclosure) can also include a RESET operation, wherein a resistive change element is adjusted from a relatively low resistive state (e.g., on the order of 100 kΩ) to a relatively high resistive state (e.g., on the order of 2 MΩ). Additionally, a "READ" operation, as defined by the present disclosure, is used to describe an operation wherein the resistive state of a resistive change element is determined without significantly altering the stored resistive state. Within certain embodiments of the present disclosure these resistive states (that is, both the initial resistive states and the new desired resistive states) are non-volatile.

Resistive change elements include, but are not limited to, two-terminal nanotube switching elements, phase change memory cells, and metal oxide memory cells. For example, U.S. Pat. No. 7,781,862 and U.S. Pat. No. 8,013,363 teach non-volatile two-terminal nanotube switches comprising nanotube fabric layers. As described in those patents, responsive to electrical stimuli a nanotube fabric layer can be adjusted or switched among a plurality of non-volatile resistive states, and these non-volatile resistive states can be used to reference informational (logic) states. In this way, resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

FIG. 1 illustrates the layout of an exemplary resistive change cell that includes a vertically oriented resistive change element (such a structure is sometimes termed a 3D cell by those skilled in the art). A typical FET device 130 is formed within a first device layer, including a drain D, a source S, and a gate structure 130c. The structure and fabrication of such an FET device 130 will be well known to those skilled in the art.

A resistive change element 110 is formed in a second device layer. Conductive structure 130a electrically couples a first end of resistive change element 110 with the source terminal of FET device 130. Conductive structure 120 electrically couples a second end of resistive change element 110 with an array source line SL outside the resistive change cell. Conductive structures 130b and 140 electrically couple the drain terminal of FET device 130 with an array bit line BL outside the resistive change cell. An array word line WL is electrically coupled to gate structure 130c.

Figure 2:
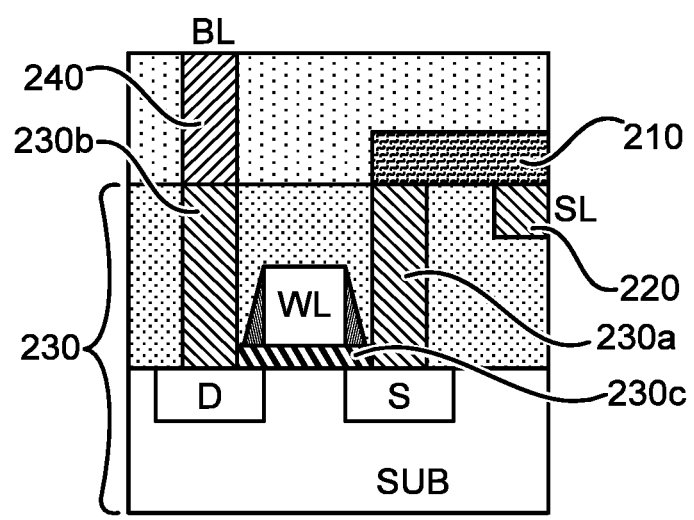
FIG. 2 illustrates an exemplary layout of a horizontally oriented resistive change cell.

FIG. 2 illustrates the layout of an exemplary resistive change cell that includes a horizontally oriented resistive change element (such a structure is sometimes termed a 2D memory cell by those skilled in the art). A typical FET device 230 is formed within a first device layer, including a drain D, a source S, and a gate structure 230c. As with the FET device (130) depicted in FIG. 1, the structure and fabrication of such an FET device 230 will be well known to those skilled in the art.

A resistive change element 210 is formed in a second device layer. Conductive structure 230a electrically couples a first end of resistive change element 210 with the source terminal of FET device 230. Conductive structure 220 electrically couples a second end of resistive change element 210 with an array source line SL outside the memory cell. Conductive structures 230b and 240 electrically couple the drain terminal of FET device 230 with an array bit line BL outside the memory cell. An array word line WL is electrically coupled to gate structure 230c.

Within both of the resistive change cells depicted in FIGS. 1 and 2, the resistive change element is adjusted between different resistive states by applying electrical stimulus, typically one or more programming pulses of specific voltages and pulse widths, between the bit line (BL) and the source line (SL). A voltage is applied to the gate structure (130c in FIGS. 1 and 230c in FIG. 2) through the word line (WL), which enables electrical current to flow through the series combination of the FET device (130 in FIGS. 1 and 230 in FIG. 2) and the resistive change element (110 in FIGS. 1 and 210 in FIG. 2). Depending on the gate voltage applied by the word line (WL), current to the resistive change element 110 may be limited by design, thereby enabling the FET device to behave as a current limiting device. By controlling the magnitude and the duration of this electrical current, the resistive change element (110 in FIGS. 1 and 210 in FIG. 2) can be adjusted between a plurality of resistive states.

The state of the resistive change element cells depicted in FIGS. 1 and 2 can be determined, for example, by applying a DC test voltage, for example, but not limited to, 0.5V, between the source line (SL) and the bit line (BL) while applying a voltage to gate structure (130c in FIGS. 1 and 230c in FIG. 2) sufficient to turn on the FET device (130 in FIGS. 1 and 230 in FIG. 2) and measuring the current through the resistive change element (110 in FIGS. 1 and 210 in FIG. 2). In some applications this current can be measured using a power supply with a current feedback output, for example, a programmable power supply or a sense amplifier. In other applications this current can be measured by inserting a current measuring device in series with the resistive change element (110 in FIGS. 1 and 210 in FIG. 2).

Alternatively, the state of the resistive change element cells depicted in FIGS. 1 and 2 can also be determined, for example, by driving a fixed DC current, for example, but not limited to, 1 µA, through the series combination of the FET device (130 in FIGS. 1 and 230 in FIG. 2) and the resistive change element (110 in FIGS. 1 and 210 in FIG. 2) while applying a voltage to the gate (130c in FIGS. 1 and 230c in FIG. 2) sufficient to turn on the FET device (130 in FIGS. 1 and 230 in FIG. 2) and measuring the voltage across the resistive change element (110 in FIGS. 1 and 210 in FIG. 2).

The resistive change element (such, but not limited to, those depicted in FIGS. 1 and 2) can be formed from a plurality of materials, such as, but not limited to, metal oxide, solid electrolyte, phase change material such as a chalcogenide glass, graphene fabrics, and carbon nanotube fabrics.

For example, U.S. Pat. No. 7,781,862 to Bertin et al., incorporated herein by reference in its entirety, discloses a two-terminal nanotube switching device comprising a first and second conductive terminals and a nanotube fabric article. Bertin teaches methods for adjusting the resistivity of the nanotube fabric article between a plurality of non-volatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure. Nanotube fabrics are described in more detail in U.S. Pat. No. 6,706,402, which is included by reference in its entirety.

While some examples of resistive change cells and elements within the present disclosure specifically reference carbon nanotube based resistive change cells and elements, the methods of the present disclosure are not limited in this regard. Indeed, it will be clear to those skilled in the art that the methods of the present disclosure are applicable to any type of resistive change cell or element (such as, but not limited to, phase change and metal oxide).

Figure 3A:
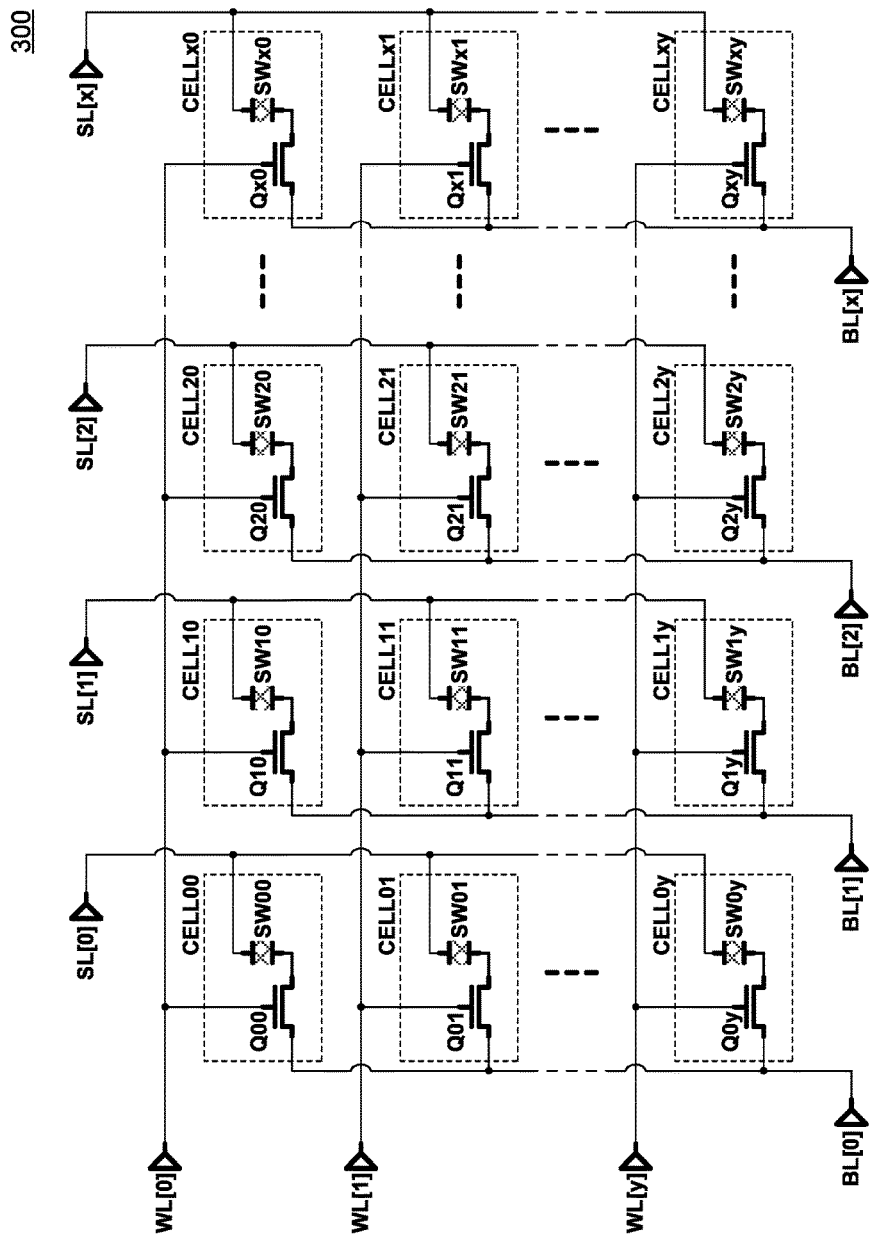
FIG. 3A is a simplified schematic illustrating an exemplary typical architecture for an array of resistive change elements in an open array architecture.

Referring now to FIG. 3A, an exemplary architecture for a typical resistive change element memory array 300 is illustrated in a schematic diagram. The array 300 comprises a plurality of cells (CELL00-CELLxy), each cell including a resistive change element (SW00-SWxy) and a selection device (Q00-Qxy). The individual array cells (CELL00-CELLxy) within resistive change array 300 are selected for reading and programming operations using arrays of source lines (SL[0]-SL[x]), word lines (WL[0]-WL[y]), and bit lines (BL[0]-BL[x]) as will be described below.

Within the exemplary architecture of FIG. 3A, the selection devices (Q00-Qxy) used with the individual array cells (CELL00-CELLxy) are conventional silicon based FETs. However, such arrays are not limited in this regard. Indeed, other circuit elements (such as, but not limited to, diodes or relays) could be used within similar architecture structures to provide cell selection functionality within an array (for example, selection device such as bipolar devices, and FET devices such as SiGe FETs, FinFETs, and FD-SOI).

FIG. 3B is a table describing exemplary programming and READ operations for the resistive change element array shown in FIG. 3A. The table lists the word line, bit line, and source line conditions required to perform a RESET operation, a SET operation, and a READ operation on CELL00 of resistive change element array 300. These operations as well as the function of the resistive change element array 300 depicted in FIG. 3A within these operations will be described in detail below.

The first column of the table within FIG. 3B describes a RESET operation of CELL00 (that is, a programming operation which adjusts the resistive state of resistive change element SW00 from a relatively low resistance to a relatively high resistance). WL[0] is driven to $V_{PP}$ (the logic level voltage required to enable select device Q00), while the remaining word lines (WL[1:y]) are driven to 0V (essentially grounded). In this way, only the select devices in the first row of the array (that is, Q00-Qx0) are enabled (or "turned on"). BL[0] is driven to $V_{RST}$ (the programming voltage level required to drive SW00 into a relatively high resistive state), and SL[0] is driven to 0V (essentially grounded). The remaining bit lines (BL[1:x]) and the remaining source lines (SL[1:x]) are held in high impedance states. In this way, $V_{RST}$ is driven across only the cells in the first column of the array (CELL00-CELL0y). As a result of these conditions, the programming voltage, $V_{RST}$, is driven only across SW00 (through enabled selection device Q00), while the other select devices within the array remain isolated from the programming voltage (and thus retain their originally programmed resistive state).

The second column of the table within FIG. 3B describes a SET operation of CELL00 (that is, a programming operation which adjusts the resistive state of resistive change element SW00 from a relatively high resistance to a relatively low resistance). As with the RESET operation, WL[0] is driven to VPP (the logic level voltage required to enable select device Q00), while the remaining word lines (WL[1:y]) are driven to 0V (essentially grounded). In this way, only the select devices in the first row of the array (that is, Q00-Qx0) are enabled (or "turned on"). SL[0] is driven to $V_{SET}$ (the programming voltage level required to drive SW00 into a relatively low resistive state), and BL[0] is driven to 0V (essentially grounded). The remaining source lines (SL[1:x]) and the remaining bit lines (BL[1:x]) are held in high impedance states. In this way, $V_{SET}$ is driven across only the cells in the first column of the array (CELL00-CELL0y). As a result of these conditions, the programming voltage, $V_{SET}$, is driven only across SW00 (through enabled selection device Q00), while the other select devices within the array remain isolated from the programming voltage (and thus retain their originally programmed resistive state).

Finally, the third column of the table within FIG. 3B describes a READ operation of CELL00 (that is, an operation which determines (measures) the resistive state of resistive change element SW00). As with the SET and RESET operations, WL[0] is driven to $V_{PP}$ (the logic level voltage required to enable select device Q00), while the remaining word lines (WL[1:y]) are held low (approximately 0V in this example) so that only the select devices in the first row of the array (that is, Q00-Qx0) are enabled (or "turned on"). SL[0] is driven to $V_{RD}$ (the voltage level required to READ the resistive state of SW00), and BL[0] is driven to 0V (essentially grounded). The remaining source lines (SL[1:x]) and the remaining bit lines (BL[1:x]) are held in high impedance states. In this way, $V_{RD}$ is driven across only the cells in the first column of the array (CELL00 -CELL0y). As a result of these conditions, the READ voltage, $V_{RD}$, is driven only across SW00 (through enabled selection device Q00), while the other select devices within the array remain isolated from the READ voltage. In this way, current will flow only through resistive change element SW00, and by measuring that current, the resistive state of SW00 can be determined.

It should be noted that the programming voltages for the RESET and SET operations ($V_{RST}$ and $V_{SET}$, respectively) as described in the preceding paragraphs were applied in opposite polarities. However, the methods of the present disclosure are not limited in this regard. Indeed, the differing polarity of the RESET and SET operations were used in order to better illustrate the functionality of the array depicted in FIG. 3A. That is to say, programming (SET and RESET) voltage and READ voltages can be driven in either polarity (that is, positive voltage on the source line or positive voltage on the bit line) dependent upon the needs of the specific type of resistive change element used or the specific programming operation in question. As will be shown in detail in the following paragraphs, this is also true of the memory array architectures of the present disclosure. Also, programming (such as SET and RESET) and READ voltages may also all be of the same polarity.

As can be seen through the discussion of FIG. 3B, with respect to the array architecture of FIG. 3A, resistive change elements are well suited for use within memory arrays. However, within certain applications, arrays of resistive change elements can exhibit certain timing and power requirements, and these requirements can—in certain applications—limit the use of such arrays within certain memory interfaces and architectures. For example, within the memory architecture detailed in FIG. 3A, the electrical capacitance of a select line or bit line could—within certain applications—represent a timing limit on how quickly the resistance of an individual cell can be sensed during a READ operation. The relatively large capacitance of the line itself and the resistance of the nonvolatile storage element, in such an application, would introduce a relatively significant RC time constant on the line in question and require a certain amount of time to charge or discharge the line. Within certain applications, resistive change elements arranged into a memory array structure may require relatively high READ voltages and/or currents in order for circuit elements situated at the end of relatively long bit lines or select lines to adequately differentiate between a RESET and SET state within an individually selected resistive change element during a READ operation. These types of timing and power requirements—which can limit the use of resistive change memory arrays within certain applications—are overcome by the resistive change element memory array architecture of the present disclosure.

A First DDR Compatible Resistive Change Element Array Architecture

Figure 4B:
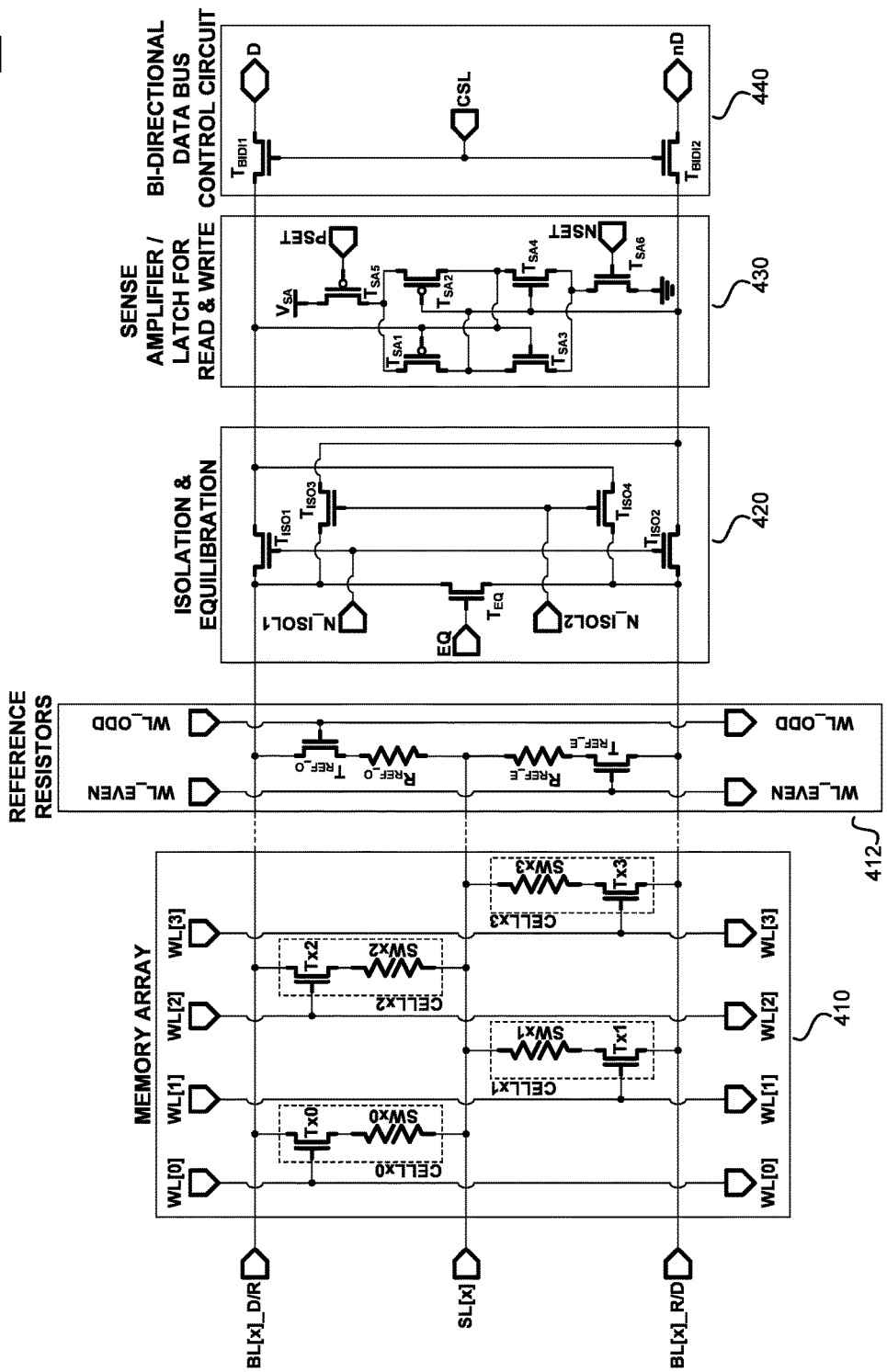
FIG. 4B is a simplified schematic for a first DDR compatible NRAM architecture illustrating a bit line pair (row "x") of a DDR compatible folded bit line resistive change memory array architecture according to the methods of the present disclosure (note that bit line columns are drawn horizontally to accommodate the bit line pairs, isolation devices, and sense amplifier circuit details).

Referring now to FIGS. 4A and 4B, a first DDR compatible memory circuit architecture for an array of resistive change elements according to the present disclosure is shown. For ease of explanation, the exemplary schematic 402 depicting a single row (row "x") of this first architecture is divided into a number of functional sections (410, 412, 420, 430, and 440). Table 401 in FIG. 4A describes each of these functional sections, and their use within both READ and WRITE operations on the array.

Looking to both FIGS. 4A and 4B, the first section 410 within this first DDR compatible architecture of the present disclosure is the memory array itself. These are the individual array cells (CELLx0-CELLx3 in FIG. 4B) themselves, each comprising a resistive change element (SWx0-SWx3, in FIG. 4B) and a selection element (FETs Tx0-Tx3, in FIG. 4B). The individual cells within memory array 410 are addressable responsive to an array of word lines (WL[0]-WL[3] in FIG. 4B), a pair of bit lines (BL[x]_D/R and BL[x]_R/D in FIG. 4B) for each row of the array, and a select line (SL[x] in FIG. 4B) for each row of the array. The use of these arrays lines in both READ and WRITE operations will be described in more detail below.

The next section 412 within this first DDR compatible architecture of the present disclosure contains the reference resistors. Each row within the array of this first DDR compatible architecture includes a pair of reference elements accessible by dedicated word lines (WL_ODD and WL_EVEN, as shown in FIG. 4B). As listed in table 401 in FIG. 4A, the reference resistors are used during READ operations on the array and are inactive during WRITE operations. The use of bit lines pairs for each row (BL[x]_D/R and BL[x]_R/D, as shown in FIG. 4B) allows READ voltages and discharge currents to be applied to a reference resistor ($R_{REF\text{-}ODD}$ or $R_{REF\text{-}EVEN}$) and a selected array cell simultaneously. By comparing discharge rates through the selected cell with a reference element the resistive state of a selected cell can be determined. The use of these reference resistors within such READ operations will be described in more detail within the discussion of FIG. 5A below.

The next section 420 within this first DDR compatible architecture of the present disclosure provides equilibration and isolation devices. These devices isolate the array cells from the sense amplifier/latch (section 430) and the bi-directional data bus control circuit (section 440) during different phases of a READ or WRITE operation. Responsive to two different isolation control signals (N_ISOLATE1 and N_ISOLATE2, as shown in FIG. 4B), the isolation devices of section 420 also provide a signal inversion function that is required with the folded bit line architecture. The use of these equilibration and isolation devices during READ and WRITE operations within the first DDR compatible architecture of the present disclosure will be described in more detail within the discussion of FIGS. 5A and 5B below.

The next section 430 within this first DDR compatible architecture of the present disclosure is a sense amplifier/latch. During a READ operation (response to control signals PSET and NSET, as shown in FIG. 4B), this sense amplifier/latch compares the bit line pair voltage discharge between the selected array cell and one of the reference elements (section 412) and latches in a logic value corresponding to the logic value stored in the selected array cell. During a WRITE (or programming) operation, this sense amplifier/latch is used to temporarily hold the data value to be stored in a selected array line cell prior to application of the programming current. The use of sense amplifier/latch 430 during READ and WRITE operations within the first DDR compatible architecture of the present disclosure will be described in more detail within the discussion of FIGS. 5A and 5B below.

The bi-directional data bus control circuit 440 within this first DDR compatible architecture of the present disclosure is a bi-directional data bus control circuit. A pair of FETs ($T_{BIDI1}$ and $T_{BIDI2}$, as shown in FIG. 4B) responsive to a control signal (CSL, as shown in FIG. 4B) enable or disable an on-chip bidirectional data bus electrical connection between the sense amplifier/latch of section 430 a data I/O buffer/driver 1067 circuit. In this way, data stored in the sense amplifier/latch during a READ operation can be provided to an off-chip external data bus, and data to be stored in a selected array cell can provided to the sense amplifier/latch from an external data bus by a data I/O buffer/driver 1067 circuit. The use of bi-directional data bus control circuit 440 during READ and WRITE operations within the first DDR compatible architecture of the present disclosure will be described in more detail within the discussion of FIGS. 5A and 5B below. The data I/O buffer/driver 1067 (FIG. 10) circuit is described further below with respect to FIG. 10.

As described above, the simplified schematic of FIG. 4B illustrates a single row (row "x") of a resistive change memory array according to the methods of the present disclosure. The simplified schematic of FIG. 4B is a folded bit line architecture in which a data storage memory cell appears at every other word line and bit line intersection, in a staggered pattern, as illustrated at the intersection of WL[0], WL[1], WL[2], WL[3] and bit line pairs BL[x]_D/R and BL[x]_R/D. Each even numbered data storage memory cell (CELLx0, CELLx2, etc.) is connected to BL[x]_D/R and an even word line (WL[0], WL[2], etc.); each odd numbered data storage memory cell (CELLx1, CELLx3, etc.) is connected to BL[x]_R/D and an odd word line (WL[1], WL[3], etc.); all data storage cells, both even and odd ones, are connected to select line SL[x]. The array select line SL[x] is approximately parallel to array bit line pair BL[x]. In this example, all array select lines are approximately parallel to array bit lines. However, resistive memory arrays may also be formed with array select lines approximately parallel to array word lines; that is, approximately orthogonal to array bit lines. One pair of reference resistors per bit line pair is included for use during READ (sensing) operations, selectable by WL_EVEN and WL_ODD, such that when WL_EVEN is activated reference resistor $R_{REF\_E}$ is connected to bit line BL[x]_R/D, and whenever WL_ODD is activated reference resistor $R_{REF\_O}$ is connected to BL[x]_D/R. WL_EVEN is activated whenever an even word line is selected and WL_ODD is activated whenever an odd word line is selected. Each bit line in the bit line pair may be a data line (D) or a reference line (R) such that only one of the bit line pairs has an active bit along the bit line. Such a folded bit line array results in common mode word to bit line capacitive voltage coupling cancellation by the differential sense amplifier/latch. This common noise cancellation scheme enables lower READ voltages and less array power. However, folded bit line structures have about half the density of open bit line architectures such as the exemplary array of resistive change architecture of FIG. 3A. The CNT switch operation is as described further above with respect to FIG. 3B. It should be noted that for layout convenience in FIG. 4B, word lines are drawn in the vertical y-axis and bit lines are drawn in the horizontal x-axis because of the level of detail along the bit line direction. In simplified memory array 300, FIG. 3A, and block diagram memory 1000, word lines are drawn in the more conventional horizontal "x" (row) direction and bit lines are drawn in the more conventional vertical "y" (column) direction.

Looking again to FIG. 4B, the memory array portion 410 of the memory array row schematic 402 is represented by four resistive change element memory cells (CELLx0, CELLx1, CELLx2, and CELLx3). As indicated by the dotted lines along the bit lines (BL[x]_D/R and BL[x]_R/D), the memory array section 410 of an array row within the architecture of the present disclosure may include more memory cells. For simplicity of illustration, however, only the first four memory cells (CELLx0, CELLx1, CELLx2, and CELLx3) are shown in the simplified schematic of FIG. 4B. It should be noted, however, that the exemplary horizontally laid out bit line (bit line pair "x") depicted in the simplified schematic 402 of FIG. 4B may include as many memory cells as required for a particular memory array (or sub-array).

Each individual memory cell (CELLx0, CELLx1, CELLx2, and CELLx3) includes a resistive change element (SWx0, SWx1, SWx2, and SWx3, respectively) and a selection device (Tx0, Tx1, Tx2, and Tx3, respectively). When enabled by an associated word line (WL[0], WL[1], WL[2], and WL[3], respectively), the selection device in each resistive change memory cell provides an electrically conductive path between one terminal of its associated resistive change memory element and one of the bit lines (BL[x]_D/R or BL[x]_R/D). Responsive to electrical stimuli provided across the associated bit line and the common select line (SL[x]), an individually selected resistive change element can be programmed into a SET or RESET state (as described above in detail with respect to FIGS. 1 and 2) or rapidly READ using the methods of the present disclosure (as described in more detail below).

According to the methods of the present disclosure, the folded bit line architecture shown in FIG. 4B provides two bit lines (BL[x]_D/R and BL[x]_R/D) for each horizontally laid out bit line pair in the memory array. Depending on the physical position of a memory cell being accessed, each of these two bit lines alternates between acting as the active bit line for a selected memory cell and being used to provide access to one of two references cells within the memory array row. Within the exemplary schematic of FIG. 4B, BL[x]_D/R acts as the active bit line for the "even" memory cells (CELLx0 and CELLx2) and acts as the reference bit line for the "odd" memory cells (CELLx1 and CELLx3), with BL[x]_R/D acting in the inverse capacity (active for the "odd" cells and reference for the "even" cells).

As described above, the two reference cells (section 412) provided within the horizontally laid out bit line pair architecture schematic of FIG. 4B allow for rapidly reading the state of an individually selected resistive change memory cell. $T_{REF-ODD}$ and $R_{REF-ODD}$ comprise the reference cell used to READ the "odd" positioned memory cells within the array row (CELLx1 and CELLx3), and $T_{REF-EVEN}$ and $R_{REF-EVEN}$ comprise the reference cell used to READ the "even" positioned memory cells within the array row (CELLx0 and CELLx2). $T_{REF-ODD}$ and $T_{REF-EVEN}$ are selection devices (analogous to selection devices Tx0-Tx3) and are responsive to two dedicated word lines (WL_ODD and WL_EVEN, respectively). $R_{REF-ODD}$ and $R_{REF-EVEN}$ are reference elements (for example, but not limited to, fixed resistors or other resistive change elements programmed into a stable reference state). The electrical resistance of these reference elements is fixed to a value between the threshold "low" resistance value (the SET resistance) and the threshold "high" resistance value (the nominal RESET resistance) for the type of resistive change element technology being used. The use of these reference elements during a READ operation will be discussed in detail within the discussion of FIG. 5A below.

It should be noted that while the selection devices (e.g., Tx0-Tx3, $T_{REF-ODD}$, and $T_{REF-EVEN}$) shown in the exemplary schematic of FIG. 4B are shown to be field effect transistors (FETs), the methods of the present disclosure are not limited in this regard. Indeed, other types of circuit elements capable of regulating or otherwise modifying a conductive path between two nodes in an electrical circuit can be used as selection device within the methods of the present disclosure. Such selection devices can include, but are not limited to, diodes, relays, and other resistive change memory elements. For example, bipolar transistors may be used. Similarly, FinFET devices may also be used as select devices. However, selection devices not requiring a semiconductor substrate may also used. For example, fully-depleted silicon-on-insulator (FD-SOI) devices and carbon nanotube FET (CNTFET devices) may also be used, and when combined with CNT resistive storage devices, enable chips fabricated entirely on insulator material. This enables stacking memory layers on one another to achieve greater densities. FD-SOI and CNTFET devices also have the added benefit of substantially lower soft error (SER) rates.

Section 430 of the array row schematic shown in FIG. 4B provides a sense amplifier/latch electrically coupled to the two bit lines (BL[x]_D/R and BL[x]_R/D) of the array row through an isolation element (transfer device) represented by section 420 of the array row schematic 402. During a READ operation, either N_ISOLATE1 (which enables FETs $T_{ISO1}$ and $T_{ISO2}$) or N_ISOLATE2 (which enables FETs $T_{ISO3}$ and $T_{ISO4}$) is activated to electrically couple the two bit lines of the array row (one bit line discharging through a selected resistive change element and the other bit line discharging through one of the two reference elements) to the sense amplifier/latch 430 (comprising FETs $T_{SA1}$-$T_{SA6}$). The two separate isolation controls (N_ISOLATE1 and N_ISOLATE2) are necessary to prevent data inversion when the "odd" numbered cells are READ. Activating N_ISOLATE1 electrically couples BL[x]_D/R to the positive terminal of the sense amplifier/latch 430 (as is required when CELLx0 or CELLx2 is being READ). And, activating N_ISOLATE2 electrically couples BL[x]_R/D to the positive terminal of the sense amplifier/latch 430 (as is required when CELLx1 or CELLx3 is being READ).

As will be explained in more detail with respect to the READ operation timing diagram of FIG. 5A, during the discharging of the two bit lines the PSET and NSET controls are activated, causing the sense amplifier/latch 430 to temporarily store the data value represented by the programmed resistive state of the selected resistive change element. The isolation element 420 can then isolate the memory array portion of the array row from the sense amplifier 430 (by deactivating both N_ISOLATE1 and N_ISOLATE2, and the informational state of the selected memory cell can be READ out at any time through bi-directional data bus control circuit 440 responsive to the CSL control.

It should be noted that the EQ control within the isolation stage 420 of the array row schematic of FIG. 4B is activated just prior to the READ operation to equilibrate the bit line pair voltages and then de-activated prior to word line activation during the READ cycle. The EQ control and its associated circuit element $T_{EQ}$ are only used for bit line pair equilibration during a READ operation. The EQ control is not active during a WRITE operation. The READ operation is described further below with respect to FIGS. 4B and 5A.

During a WRITE operation using this first DDR compatible architecture, data pulses (representing the data values to be written) come into to the array through an on-chip data input/output buffer/driver connected to a data bus that transmits eight bits at a time to a digital interface to the sense amplifier as described in detail with respect to FIG. 10 further below. This input/output buffer puts eight bits on the data bus during every positive array clock transition, and this data is then transmitted via the bi-directional data bus control circuit (440 in FIG. 4B) to the sense amplifier/latch (430 in FIG. 4B). The isolation devices (420 in FIG. 4B) are activated, and the data in the sense amplifier/latch is then transmitted to array bit lines (BL[x]_D/R and BL[x]_R/D in FIG. 4B) through those isolation devices. The array cell (or cells) to be written is enabled through its associated word line, and a programming current is permitted to flow through the selected resistive change element (or elements) from its associated bit line to the select line (SL[x] in FIG. 4B) to perform a WRITE function. As discussed previously, voltage driven onto the bit lines from the sense amplifier/latch 430 (driven by the input/output buffer) is selected to provide a sufficient programming current through the resistive change element in order to adjust the resistive state of the resistive change element.

Within certain applications such as page mode operation, for example, to facilitate compatibility with DDR memory functionality, all bits within an array are rendered into a RESET state during READ operations in the example described further below. However, other methods may be used. For example, all bits within an array may be rendered into a SET state. Alternatively, bits may be in either SET or RESET state. Because in this example all bits are in the RESET state at the start of a WRITE operation, all storage elements within the array can be assumed to be in a high resistance (RESET) state, corresponding to a logic '0'. As such, a WRITE operation, within these certain applications, will only have to provide programming SET currents to those array cells required to be programmed back into a SET state, a low resistance state, corresponding to a logic '1'. WRITE operations using the first DDR compatible architecture of the present disclosure will be described in more detail with respect to FIG. 5B below.

Figure 5A:
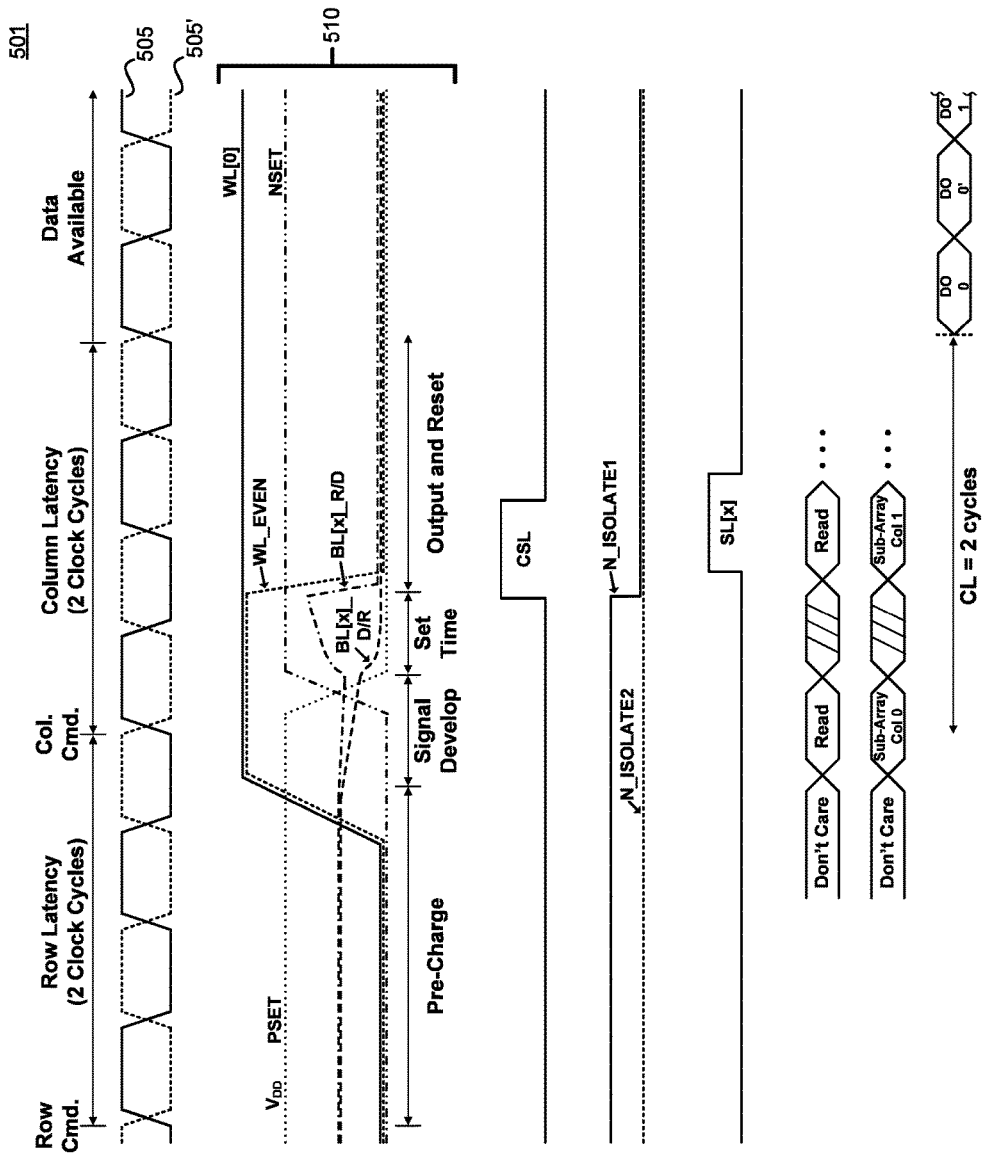
FIG. 5A is a waveform timing diagram illustrating an exemplary READ operation performed on a cell within the first DDR compatible NRAM array architecture detailed in FIG. 4B (note that the waveform diagram of FIG. 5A READ operation also applies to the second DDR compatible NRAM array architecture detailed in FIG. 6B, as the READ operations within both architectures are identical).

Referring now to FIG. 5A, a timing diagram 501 detailing an exemplary READ operation first on a single array cell within a DDR compatible resistive change element array using the first architecture of the present disclosure (as shown in FIG. 4B and discussed above) is shown. Within the exemplary timing diagram 501 of FIG. 5A, it is assumed that the resistive change element within the array cell being READ has been programmed into a low resistance SET state (corresponding to a logic "1").

Referring to READ timing diagram 501, a clock signal (CLK) 505 is used to synchronize the DDR NRAM timing digital interface with the timing of a microprocessor or other digital external control circuit element interfacing with the memory array architecture of the present disclosure. In DDR operation the data rate on the external bus (I/O) is twice (2-times) the data rate on the internal (on-chip) data bus. That is, the data on the internal data bus changes with each positive (up) transition of clock signal 505, while the data on the external I/O data bus changes with both positive (up) and negative (down) transitions of clock signal 505, such that both internal data bus and external data bus transitions remain synchronized with clock signal 505. In this example, referring to timing diagram 501 illustrated in FIG. 5A, synchronized data transitions on both internal data bus and external data bus are achieved by generating a second clock signal 505' that is 180 degrees out of phase with respect to clock signal 505. In this way, for example, eight data bits can be READ to the 8-bit internal data bus with each positive (up) transition of clock signal 505 and these data bit signals transmitted to the data I/O buffer/driver 1067. The data I/O buffer/driver 1067 multiplexes the eight data signals onto the 4-bit external data bus in two sets of four data bit signals at twice (2-times) the internal data bus data rate by using a combination of clock signal 505 and second clock signal 505'. That is, the data on the external data bus transitions with each positive (up) transition of clock signal 505 and each positive (up) transition of the second clock signal 505'. The internal data bus, data I/O buffer/driver 1067, and external data bus are illustrated in FIG. 10.

Generating an on-chip out-of-phase clock signal is one method of achieving a synchronized data rate at twice the data rate on the external data bus with respect to the internal data bus. Other methods may be used as well. While this example describes doubling the external data rate with respect to the internal data rate, similar methods may be used to achieve triple the data rate (a DDR3 NRAM), four times the data rate (a DDR4 NRAM), and even higher synchronized data rates.

Referring to READ timing diagram 501, signal development and sensing 510 waveforms on a selected bit line pair correspond to a stored data value in a selected cell in memory array (sub-array) 410 illustrated in FIG. 4B. Referencing signal development and sensing waveforms 510, the selected bit line pair (BL[x]_D/R and BL[x]_R/D]) are equilibrated to the same voltage, in this example approximately $V_{DD}/2$, during the pre-charge phase of the READ cycle by activating EQ, which is then turned off when activating the selected word line and corresponding reference word line within memory array (or sub-array) 410 illustrated in FIG. 4B. It should be noted that while $V_{DD}/2$ is chosen as the equilibration voltage in this example, other values such as $V_{DD}$, any voltage between $V_{DD}/2$ and $V_{DD}$, and voltages less than $V_{DD}/2$ may also be used. Next, the selected word line, WL[0] in this example, transitions to $V_{DD}+V_{TH}$ and turns on select device Tx0 in CELLx0, which connects resistive change element SWx0 to bit line BL[x]_D/R thereby initiating signal development. In this example, CELLx0 is assumed to be set to a low resistance SET representing a "1" logic state. WL_EVEN is also activated at approximately the same time as WL[0] and also transitions to $V_{DD}+V_{TH}$ and turns on reference device $T_{REF\_E}$ that connects reference resistor $R_{REF\_E}$ to bit line BL[x]_R/D. Both pre-charged bit lines have the same bit line capacitance and both discharge through resistive elements. However, each BL in the bit line pair is connected to a different resistive element resulting in different RC time constants and therefore different rates of discharge and corresponding voltage reduction rates. An amount of time, referred to as signal develop in signal development and sensing waveforms 510, is allowed and the duration depends on the sensitivity of the sense amplifier. For example, if differential the sense amplifier/latch 430 (FIG. 4B) switches at a difference voltage of 50 mV, then the signal develop time is selected to allow a 50 mV differential signal to form. However, if differential the sense amplifier/latch 430 is much more sensitive and switches at a difference voltage of 5 mV for example, then a shorter signal develop time is used. When a sufficient signal develop time is reached, the sense amplifier/latch 430 is turned on and latches the signal based on the difference voltage between bit lines B[x]_D/R and B[x]_R/D after a sufficient set time. Voltage coupling between word line WL[0] and reference word line WL_EVEN to bit lines B[x]_D/R and B[x]_R/D are rejected as common mode noise by differential the sense amplifier/latch 430.

Near the end of the signal develop time in this exemplary READ cycle, sense amplifier/latch 430 is activated as follows. PSET is driven to a low voltage, turning on FET $T_{SA5}$ and thereby connecting terminals FETs $T_{SA1}$ and $T_{SA2}$ to power supply $V_{SA}$ ($V_{SA}=V_{DD}$ for a READ operation in this example). NSET is driven to a high voltage, $V_{DD}$ for example, turning on FET $T_{SA6}$ and thereby connecting terminals FETs $T_{SA3}$ and $T_{SA4}$ to ground. At this time, sense amplifier/latch 430 has been powered up and senses/latches the data signal from cellx0. While N_ISOLATE1 may be enabled (with N_ISOLATE2 disabled) just after activation of the sense amplifier/latch, typically, N-ISOLATE1 is enabled earlier in the READ cycle prior to the activation of sense amplifier/latch 430, for example, at the beginning of the READ cycle. In this way, the sense amplifier/latch (section 430 in FIG. 4B) is coupled through the non-inverting path of the isolation element (section 420 in FIG. 4B) to the memory array and prepared to latch and temporarily hold the data value of the selected cell.

SL[x], the select line common of all the cells within the array row, is held low. And, CSL is held low, disabling bi-directional data bus control circuit 440 (FIG. 4A), until the array data is latched by sense amplifier/latch 430.

Memory arrays, such as memory array 410, are formed using multiple sub-arrays in which a memory sub-array line may contain thousands of individual memory cells. The length of these array lines results in relatively large line capacitance on these bit lines, which can result in relatively large time constants when combined with the resistance of the nonvolatile resistive change elements and limit speed at which these bit lines can charge and discharge due to RC time constants. By using folded bit line pairs such as (BL[x]_D/R and BL[x]_R/D) and differentially sensing bit line pair signals at small differential signal values, sense time can be significantly reduced resulting in faster READ times and faster data rates, such as page mode data rates for example. This is because the methods of the present disclosure, using folded bit line array pairs and differential sensing, do not require that either bit line in the bit line pair completely, or even mostly, discharge to determine the resistance value stored in the selected resistive change element (SWx0), thereby reducing timing delays associated with relatively high capacitance, long bit lines. Faster sensing at lower voltages for the folded array architecture illustrated in FIG. 4B may also result in lower operating power as well. Within applications with very large memory array sizes (for example, but not limited to, 1 Gb or higher), low power READ operations can become a critical design consideration.

Within the exemplary READ operation detailed in FIG. 5A, as illustrated by signal development and sensing waveforms 510, BL[x]_D/R has discharged more quickly than BL[x]_R/D, which indicates that the electrical resistance of SWx0 in CELLx0 is at a significantly lower resistance value (SET state) than the resistance value of $R_{REF-EVEN}$. And since the resistance value of $R_{REF-EVEN}$ has been selected to be a value between a nominal "high" resistance value and a nominal "low" resistance value (as determined by the design and technology of the resistive change elements used in the memory array), this difference in discharge is indicative of low resistance value (or a logic "1") being stored in CELLx0 as described further above and sense amplifier/latch 430 latches and holds a logic "1" state. However, if the electrical resistance of SWx0 in CELLx0 were high (RESET state) representing a logic "0", then BL[x]_D/R would discharge more slowly than BL[x]_R/D because the SWx0 would have a higher resistance than the reference resistor $R_{REF-EVEN}$ and therefore discharge more slowly and sense amplifier/latch 430 latches and holds a logic "0". The logic value held in sense amplifier/latch 430 can be READ out to the on-chip data bus by bi-directional data bus control circuit 440 (FIG. 4B) when CSL is activated by controlling circuitry outside of the memory array.

In the final stage of the READ operation shown in FIG. 5A (the "output and reset" stage), N_ISOLATE1 is driven low, isolating the sense amplifier/latch 430 (FIG. 4B) from memory array 410 (FIG. 4B). Bi-directional data bus control circuit 440 is activated by CSL and the logic value stored in the sense amplifier/latch 430 (FIG. 4B), corresponding to the data stored in the selected array cell, is connected to data output line (D), with its inverse (complement) driven out simultaneously on inverted data output line (nD), onto the on-chip 8-bit data bus, and to the input of the data I/O buffer/driver 1067. The data I/O buffer/driver 1067 (FIG. 10) then latches the data and drives the external 4-bit data bus at two times the data rate as the internal data bus as described further above. In this example, data first appears on the external data bus two clock cycles after the column address is received from the control device. While the DDR NRAM may be operated in a random access mode, typically a page of data is READ out (page mode) as illustrated in FIG. 5A. When data transfer is complete, CSL disables the connection between sense amplifier 430 and bi-directional data bus control circuit 440.

While resistive change elements are non-volatile (that is, they retain their programmed informational state during READ operations or when power is removed from the device), certain types of memory architectures (such as, but not limited to, DRAM capacitive storage memories) result in destructive READ operations. That is, in a conventional DRAM DDR memory array, for example, a READ operation on a cell would destroy the data stored in the cell itself. This data would then have to be written back from the corresponding sense amplifier/latch to the selected cell in the array in a write-back operation. Hence, the amplifier/latch would remain connected to the corresponding bit line pair during the completion of the READ operation cycle in order to restore the original state of cell. However, since a resistive change memory such as an NRAM, for example, performs a non-destructive READ operation, data remains in the array cell, and there is no data write-back requirement from sense amplifier/latch 430, which can be decoupled from the array. Therefore, in this NRAM example, N_ISOL1 is deactivated and transfer devices $T_{ISO1}$ and $T_{ISO2}$ decouple sense amplifier/latch 430 from memory array 410 bit lines BL[x]_D/R and BL[x]_R/D, also WL_EVEN decouples reference resistor $R_{REF\_E}$ from bit line BL[x]_R/D, and both bit lines are driven to zero (ground) voltage, as shown by signal development and sensing waveforms 510, since data is latched into sense amplifier/latch 430 for transfer to the on-chip data bus. In this example, since no data write-back is needed, a programming operation may be performed at the end of the READ cycle. Selected word line WL[0] remains activated thereby enabling a RESET operation when SL[x] transitions to a RESET voltage, bit lines are grounded, and SL[x] drives the selected bit to a high resistance RESET state if the cell was in a low resistance SET state. If the cell was in a high resistance RESET state, it remains unchanged in the RESET state. This enables resistive memories such as NRAMs to complete a RESET cycle while data from sense amplifier/latch 430 is transferred via the on-chip data bus to the data I/O buffer/driver 1067 and onto the off-chip output bus. Leveraging the non-volatility of resistive memory bits by RESETTING selected bits to a high resistance state during the completion of the READ cycle simplifies the WRITE operation as described further below. To illustrate this functionality within the memory array architecture of the present disclosure, the exemplary READ operation detailed by timing diagram 501 in FIG. 5A shows a RESET operation concurrent with the data READ out operation (that is, during the time that CSL is activated and the READ data is provided to the external data bus).

Specifically, within this RESET operation, SL[x] is driven high to a required RESET voltage (as described in detail above with respect to SET and RESET operations on resistive change elements) while both of the row's bit lines (BL[x]_D/R and BL[x]_R/D) are pulled low. WL_EVEN is also driven low, preventing any programming current from passing through reference element $R_{REF-EVEN}$, and WL[0] remains driven high, enabling access to CELLx0. In this way, a programming current is driven through CELLx0 and SWx0 is driven into a RESET state. The remaining word lines (WL[1]-WL[3]) remain low, so the data in remaining memory cells (CELLx1, CELLx2, and CELL x3 in FIG. 4B) remains unchanged. It should be noted that, as discussed above, such a RESET operation on the READ memory cell is not required within the methods of the present disclosure and but is included to illustrate the functionality and advantages of the DDR NRAM architecture presented in FIGS. 4B and 5A.

Figure 5B:
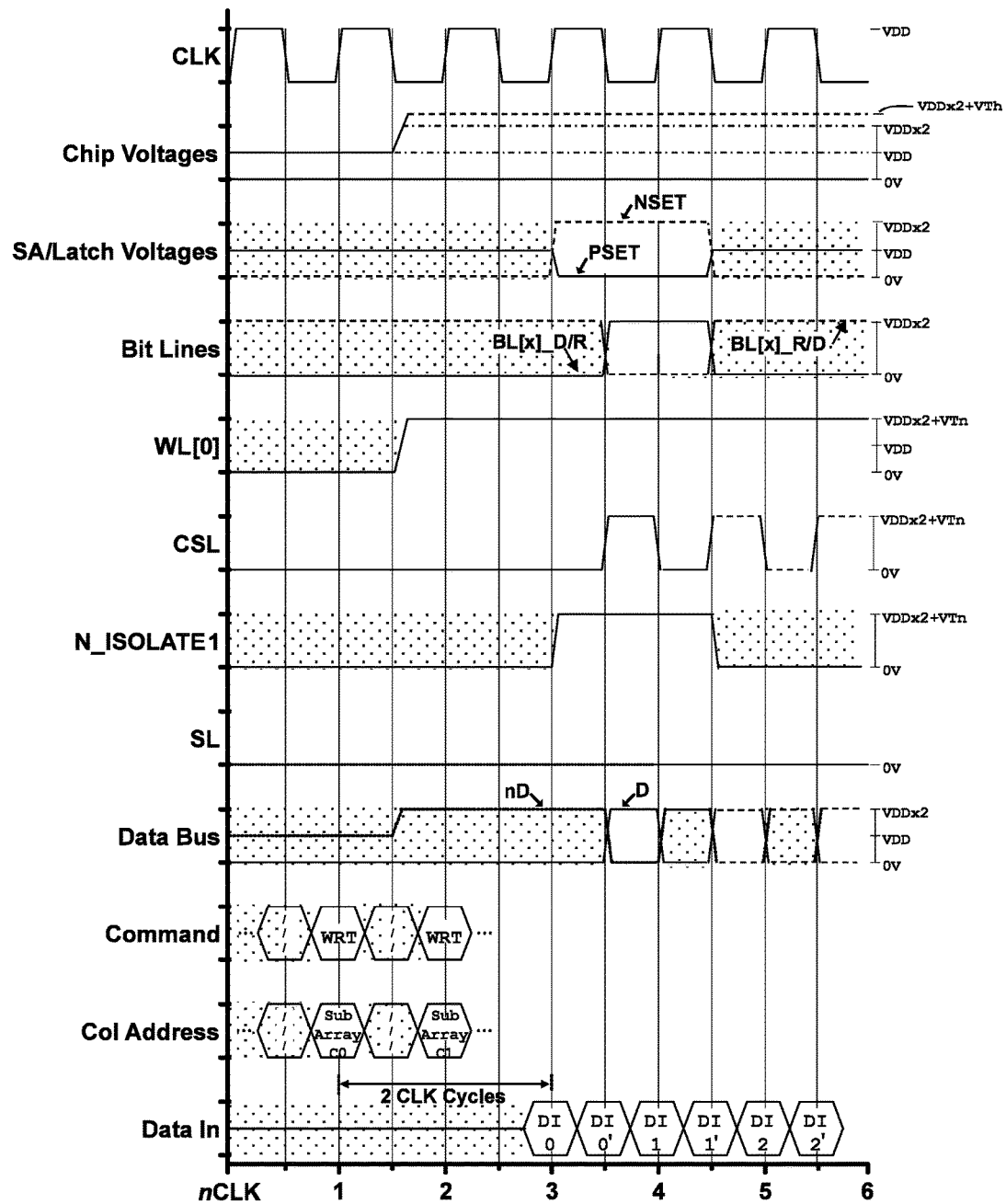
FIG. 5B is a waveform timing diagram illustrating an exemplary WRITE operation performed on a cell within the first DDR compatible NRAM array architecture detailed in FIG. 4B.

Referring now to FIG. 5B, a timing diagram 550 is shown for a WRITE (programming) operation for a first DDR compatible memory circuit architecture. Timing diagram 550 details an exemplary WRITE (programming) operation on a single array cell within a DDR compatible resistive change element in the array of the present disclosure shown in FIG. 4B and discussed above. Within the exemplary timing diagram 550 of FIG. 5B, it is assumed that the resistive change element within the array cell being adjusted from a high resistance RESET state (corresponding to a logic "0") into a low resistance SET state (corresponding to a logic "1").

As described above with respect to FIG. 5A, using the first DDR compatible array architecture of the present disclosure, a READ operation on a selected array cell can be READ and RESET within the same cycle. This READ and RESET method ensures that a selected array cell is in a RESET state (that is, a relatively high resistive state, corresponding to a logic '0') at the conclusion of a READ cycle. A WRITE operation on such a cell, then, would only have to apply a programming SET current on an array cell required to be put into a SET state (that is, a relatively low resistive state, corresponding to a logic '1'). In this way, this first architecture (as detailed in FIG. 4B) can be used with a traditional DDR interface. Further, within certain applications, such a READ/RESET/WRITE process can provide enhanced speed and lower power operation of the resistive change element array. To this end, the exemplary WRITE operation detailed in FIG. 5B provides a SET operation on a selected cell within a resistive change element array using the first DDR compatible array architecture of the present disclosure (CELLx0 as shown in FIG. 4B).

Within the READ operation detailed in FIG. 5A, the sense amplifier/latch 430 shown in FIG. 4A can be operated at relatively low voltages (for example, on the order of 1V). As such, the voltage levels used on the bit lines (BL[x]_D/R and BL[x]_R/D), and within the sense amplifier/latch 430 can be, in certain applications, the system level voltage level used by the external controlling circuitry ("$V_{DD}$"). In this way, the data pulses transmitted to an external data bus through the bi-directional data bus control circuit (440 in FIG. 4B) are also at $V_{DD}$ as they transmitted from the array. However, in certain applications, a WRITE (or programming) operation within the first DDR compatible NRAM architecture of the present disclosure (again, as illustrated in FIG. 4B) may require significantly higher voltages to induce a sufficient programming current through a selected array cell. For example, a WRITE operation might require a voltage level of twice the system level voltage ($V_{DD}$×2) to be driven on a bit line associated with a selected array cell, requiring this higher voltage to be, at least temporarily, driven onto the on-chip data bus lines (D and nD in FIG. 4B) as well. To illustrate this, the required programming voltage within the exemplary WRITE operation detailed in FIG. 5B is imagined to be $V_{DD}$×2.

Referring to resistive change memory 1000 illustrated in FIG. 10, described further below, and first DDR compatible resistive change element array architecture schematic 402 illustrated in FIG. 4B, a DDR programming (WRITE) operation is described with respect to timing diagram 550 shown in FIG. 5B. Referring to table 401 in FIG. 4A, reference resistors 412 in schematic 402 are inactive during a WRITE operation. As described above with respect to FIG. 4B, memory array 410 uses a folded bit line architecture, and bit line pair BL[x] represents any folded bit line pair intersecting all word lines in a memory array or memory sub-array. Only one word line at a time is selected (activated) during the WRITE operation and corresponds to a row address in the row address buffer (FIG. 10). As described further above with respect to FIG. 4B, in a folded bit line architecture, cells are staggered such that BL[x]_D/R contains the data input to array 410 when an even word line is activated and BL[x]_R/D contains the data when an odd word line is activated. In this WRITE example, even numbered word line WL[0] is selected. Therefore, CELLx0 illustrated in memory array 410 is selected and the WRITE operation stores data in nonvolatile storage element SWx0. Select line SL[x] is held at a low voltage (ground for example) for a WRITE operation to either even or odd numbered word lines. A column address buffer (FIG. 10) contains the column address locations for the WRITE operation. Timing diagram 550 for a first DDR compatible resistive change element array architecture illustrates a high speed page mode WRITE operation to a pre-selected word line, WL[0] in this example. An on-chip clock CLK signal synchronizes the memory's digital interfaces to an external controller or processor. Input data from an external (off chip) 4-bit data bus arrives at the digital interface of the resistive change memory (FIG. 10) with each positive and negative transition of the clock and eight bits are latched into a data I/O buffer/driver 1067 (FIG. 10) in two groups of 4 bits. Then, at each positive transition of the clock, the eight bits are transferred to the 8-bit on-chip data bus, and bi-directional data bus control circuit 440 (FIG. 4B) is activated and transfers the eight bits to eight sense amplifiers and are written into memory array 410 (FIG. 4B). If there are 2048 bits along a word line, such as word line WL[0] in this example, then the WRITE operation of all bits to be written along word line WL[0] is completed after 256 clock cycles. Then another word line will be selected, WL[1] for example, and similar WRITE operations will be performed. And so on until the entire page is written and the WRITE operation is complete. Timing diagram 550 shows only WL[0] and one representative bit line pair BL[x]. However, it is representative of the WRITE operation for all bits written to memory array 410 of schematic 402 illustrated in FIG. 4B.

Looking again to FIG. 5B, a clock signal (CLK) is used to represent the external synchronization timing requirements of the DDR NRAM memory. Throughout the first clock cycle (between "clock 0" and "clock 1"), the array voltages (represented by the "Chip Voltages" waveform) are all at $V_{DD}$. Select line SL[x] voltage remains low (ground for example) during the entire WRITE cycle. $V_{DD}$ is typically, but not limited to, a voltage of approximately 1 V. The row address has been activated, and word line WL[0] has been selected in this example prior to the start of the first clock CLK cycle (not shown in FIG. 5B). The column address clock generator is activated (FIG. 10) by WRITE "command" WRT. The "Col Address" is received and is stored in the column address buffer (FIG. 10). Column address C0 is selected at the beginning of the WRITE cycle. There is an on chip latency (delay) of 2 CLK cycles in this example before external data is received by the data I/O Buffer/Driver 1067 (FIG. 10). Sense amplifier/latches, such as sense amplifier/latch 430 (FIG. 4B), are inactive with PSET voltage high and NSET voltage low.

At the start of the second clock cycle (between CLK 1 and CLK2) the column address clock generator is activated (FIG. 10) by WRITE "command" WRT, and "Col Address" C0 is selected. In support of the WRITE operation, on-chip voltage generators provide SET voltage $V_{SET}$ in excess of $V_{DD}$. In this example, $V_{SET}=V_{DD}\times 2$, and SET overdrive voltage $V_{DD}\times 2+V_{TH}$ using known on-chip voltage generation methods. The selected word line WL[0] in this example, illustrated in memory array 410 (FIG. 4B), transitions to $V_{DD}\times 2+V_{TH}$ to enable the full SET voltage $V_{DD}\times 2$ and WRITE current to nonvolatile storage element SWx0. However, it should be understood that in some cases it may be desirable to limit the SET current flowing into corresponding nonvolatile storage element SWx0 by operating FET Tx0 in a saturation mode. In such cases, word line WL[0] voltage may be driven to a lower voltage than $V_{DD}\times 2+V_{TH}$ to achieve a desired lower SET current flow, and may be selected to be even less than $V_{DD}\times 2$.

Referring to FIG. 5B, at the start of the third clock cycle (between CLK2 and CLK3) "Command" and "Col Address" are activated in this and each of the subsequent cycles as described with respect to cycles 1 and 2 above. "Data in" begins with data input DI0 from the 4-bit external data bus, which is latched by the data I/O buffer/driver 1067 (FIG. 10) by the end of cycle 3, during the positive transition of clock "CLK". The incoming data pulses on the external 4-bit data bus transition between 0 and $V_{DD}$ voltages for both rising and falling transitions of the clock CLK. These external data pulses are received by the data I/O buffer/driver 1067 in two groups of 4 bits, DI0 and DI0'. Data I/O buffer/driver 1067 (FIG. 10) boosts the voltage to a WRITE voltage of $V_{DD}\times 2$ and transmits data waveforms corresponding to 8 bits over the bidirectional internal data bus to bi-directional data bus control circuit 440 (FIG. 4B) at each positive transition of clock CLK, where D and nD pulses transition in a voltage range of zero to $V_{DD}\times 2$ as shown in timing diagram 550 (FIG. 5B).

Figure 8A:
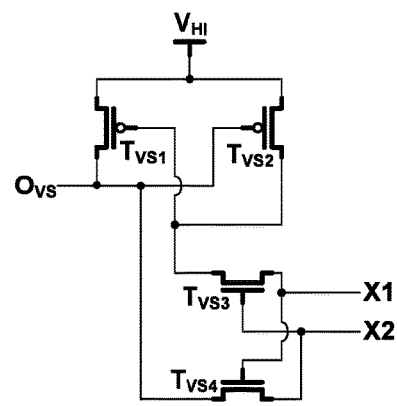
FIGS. 8A-8C are a series of annotated schematic diagrams detailing the operation of the voltage shifter element within the second DDR compatible NRAM array architecture detailed in FIG. 6B.

A voltage shifter circuit, such as voltage shifter circuit 801 shown in FIG. 8A, may be positioned between data I/O buffer/driver 1067 and the 8 bit on chip data bus (FIG. 10) to generate pulses in a voltage range of zero to $V_{DD}\times 2$ for WRITE operations. Voltage shifter circuit 801 is activated during WRITE operations and is inactive (bypassed) during READ operations. Alternatively, voltage shifter circuit 801 (FIG. 8A) may be incorporated as part of the bi-directional data bus control circuit 640 and activated only during WRITE operations.

Continuing with the third clock cycle timing description, sense amplifier/latches are activated by "SA/Latch voltages" at the end of cycle 3. PSET transitions from $V_{DD}$ to ground thereby connecting FET $T_{SA5}$ to sense amplifier voltage $V_{SA}$, with $V_{SA}=V_{SET}=V_{DD}\times 2$ for a WRITE operation (sense amplifier/latch 430, FIG. 4B, for example). NSET transitions from zero to $V_{SET}=V_{DD}\times 2$ voltage thereby connecting FET $T_{SA6}$ to a low voltage (ground). "SA/Latch voltages" shows one of the eight sense amplifiers activated during the first WRITE cycle. Since in this page mode example there are 256 WRITE cycles needed to WRITE all the bits along word line WL[0], the sense amplifier/latch remains activated long enough to latch and temporarily hold a data bit until completion of the first WRITE cycle. It is then deactivated until after another 255 WRITE cycles are completed in order to save power. It is reactivated (not shown) when a new word line is selected by a row decoder (FIG. 10). The column decoder (FIG. 10) selects the eight sense amplifiers again, and the next WRITE cycle begins. "N-ISOLATE1" is activated at the end of cycle 3 because word line WL[0] in this example is an even numbered word line, and is also activated for any other even numbered word line chosen. N-ISOLATE 1 is used to connect sense amplifier/latch 430 to memory array 410 as illustrated in FIG. 4B. However, N_ISOLATE2 (not shown in this example) would be activated instead for each odd numbered word line if selected. N_ISOLATE1 is shown to be deactivated after completion of the first WRITE cycle to decouple the sense amplifier/latch from the array until all bits are written along word line WL[0] and a new word line is selected. Alternatively, since the corresponding sense amplifier/latch is deactivated, the N_ISOLATE1 device could remain activated.

Referring to FIG. 5B, at the start of the fourth clock cycle (between CLK3 and CLK4), "Data in" continues with data input DI0' from the 4-bit external data bus, which is latched by the data I/O buffer/driver 1067 (FIG. 10) in mid-clock cycle 4, during a negative transition of clock "CLK". At this point in the cycle, the 8 bits represented by DI0 and DI0' are available from the data I/O buffer/driver 1067 on the 8-bit bidirectional "Data Bus". "CSL" activates bi-directional data bus control circuit 440 (FIG. 4B) connecting the 8-bit on-chip data bus to each of eight sense amplifier/latches, such as sense amplifier/latch 430, that latch and temporarily hold the data and drive corresponding "Bit Lines". In this example, timing diagram 550 shows one of the eight selected sense amplifiers activated and receiving a logic "1" state, corresponding to data bus input "D" illustrated timing diagram 550, that results in a SET operation in which bit line BL[x]_D/R is driven to $V_{SET}=V_{DD}\times 2$ and sets nonvolatile storage element SWx0 to a low resistance value corresponding to a logic "1" state. "Bit lines" BL[x]_D/R and BL[x]_R/D are connected to opposite terminals of sense amplifier/latch 430 in this example, which shows bit line BL[x]_D/R transitioning to SET voltage $V_{DD}\times 2$, while complementary bit line BL[x]_R/D remains at a low voltage such as ground. In this example, a logic "1" data bit from one of the eight data bit inputs DI0 and DI0' is shown causing a transition from a RESET logic "0" state to a SET logic "1" state in nonvolatile storage element SWx0 for bit line pair BL[x] (FIG. 4B) in memory array 410. A logic "0" input data bit would have left nonvolatile storage element SWx0 in the RESET, logic "0" state.

Referring to FIG. 5B, during the fifth clock cycle (between CLK4 and CLK5), bit line BL[x]_D/R SET cycle is completed. "SA/Latch voltages" deactivate the corresponding sense amplifier/latch. "N_ISOLATE1" turns isolation transistors to an off state. Word line WL[0] remains active until all bits along the word line are written, which in this page mode example, requires a total of 256 cycles. The next 4-bit DI1 data inputs are received from the external data bus during a positive transition of the clock CLK, then 4-bit DDI1' data inputs are received during the negative transition of the clock CLK. The 8 bits are temporarily latched by data I/O buffer/driver 1067 (FIG. 10) and transmitted to the 8-bit on-chip data bus. CSL is activated and the eight data bits are routed to another 8 sense amplifier/latches corresponding to another column address decoded by the column decoder (FIG. 10). Another 8 bits are written along selected word line WL[0] but at other cells and corresponding storage element locations in memory array 410 (FIG. 4B). The activation of these other sense amplifier/latches and turning on of the activation devices is similar to those illustrated in timing diagram 550 except that they occur during later clock cycles. The 8-bit data WRITE operation is repeated again with input data DI2 and DI2' in cycle 6 (cycle 5 to cycle 6), and so on, until all bits along selected word line WL[0] are written. In this page mode example, 2048 bits are written along word line WL[0] in 256 cycles. The DDR page mode WRITE operation then continues with a new word line when WL[0] is deactivated, and another word line, WL[1] for example, selected by the row decoder is activated. The waveforms shown in timing diagram 550 (FIG. 5B) are repeated until all bits in the page have been written.

As discussed above, the exemplary WRITE operation detailed in FIG. 5B is used to adjust a selected array cell initially in a high resistance RESET state (corresponding to a logic '0') into a low resistance SET state (corresponding to a logic '1') by applying a required SET voltage ($V_{DD} \times 2$ within this exemplary WRITE operation) to the data bus line (D). However, it should be noted that this WRITE operation could have left this selected array cell in its initial RESET state by simply leaving the data bus line (D) low (driven at 0V, for example) for the WRITE operation as would be consistent with the READ/RESET operation discussed with respect to FIG. 5A above. Further, in other applications this exemplary WRITE operation could have also been used to adjust a resistive change element initially in a low resistance SET state into a high resistance RESET state by driving the data bus line with a required RESET voltage (as discussed previously).

A Second DDR Compatible Resistive Chance Element Array Architecture

As discussed in detail above with respect to FIGS. 4A, 4B, 5A, and 5B, the first DDR compatible resistive change element array architecture of the present disclosure can, in certain applications, result in relatively high voltage data pulses on the internal data bus during WRITE (or programming) operations as compared to the system level voltages being used by digital circuitry controlling the array. Within such applications, these higher voltages may require high voltage-compatible transistors along the entire data path (including the sense amplifier/latch). And—again, within certain application—these larger, high voltage components could represent scaling and/or cost limitations within a memory array design. To this end, the second DDR compatible resistive change element array architecture of the present disclosure is presented. This second architecture includes a voltage shifting element, which can be used within these certain applications, to reduce or otherwise eliminate the need for large and high voltage rated components.

Figure 6B:
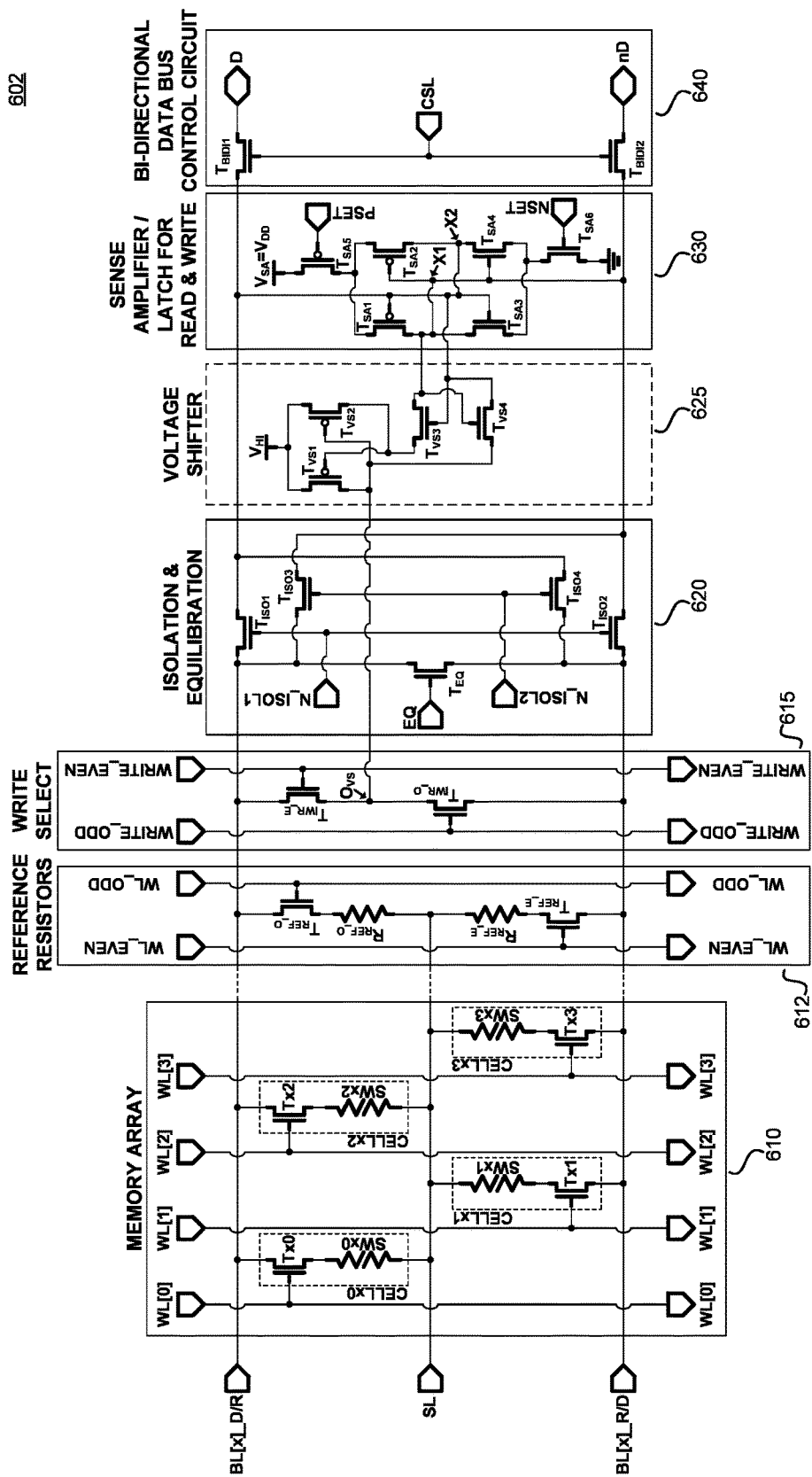
FIG. 6B is a simplified schematic for a second DDR compatible NRAM architecture illustrating a bit line pair (row "x") of a DDR compatible folded bit line resistive change memory array architecture according to the methods of the present disclosure (note that bit line columns are drawn horizontally to accommodate the bit line pairs, isolation devices, voltage shift write circuit, and sense amplifier circuit details).

Referring now to FIGS. 6A and 6B, this second DDR compatible memory circuit architecture for an array of resistive change elements according to the present disclosure is shown. As with FIGS. 4A and 4B, for ease of explanation, the exemplary schematic 602 depicting a single row (row "x") of this second architecture is divided into a number of functional sections (610, 612, 615, 620, 625, 630, and 640). Table 601 in FIG. 6A describes each of these functional sections, and their use within both READ and WRITE operations on the array.

Looking now to both FIGS. 6A and 6B, most of the sections within the second DDR compatible architecture of the present disclosure are identical in structure and function to the first DDR compatible architecture as shown in FIGS. 4A and 4B and discussed in detail above, with the important exception of isolation and equilibration section 620 during a WRITE operation. The operation of isolation and equilibration section 620 (FIG. 6A) and isolation and equilibration section 420 (FIG. 4A) perform essentially the same function during READ. However, during a first DDR compatible architecture WRITE operation, isolation and equilibration section 420 is active and couples the relatively high SET voltage $V_{DD} \times 2$ from the sense amplifier/latch 430 to the memory array 410. Conversely, during a second DDR compatible architecture WRITE operation, isolation and equilibration section 620 is inactive and decouples the low $V_{DD}$ voltage of sense amplifier/latch 630 from memory 610, such that when a bit line in memory array 610 is driven to the relatively high SET voltage $V_{DD} \times 2$ by voltage shifter 625 and write select 615 circuit, the sense amplifier/latch 630 remains low at $V_{DD}$. Hence, unlike the first DDR compatible architecture, the second DDR compatible architecture during a WRITE operation enables the write data pulses from the 4-bit external data bus, switching between zero and $V_{DD}$, to switch in the same low voltage range through the data I/O buffer/driver 1067 FIG. 10), onto the 8-bit on chip data bus, through bi-directional data bus control circuit 640, and be temporarily latched by sense amplifier/latch 630 also operating between zero and $V_{DD}$, thereby realizing the benefits of the second DDR compatible architecture described further above. The operation of voltage shifter 625 and write select 615 are described further below.

The first section 610 within this second DDR compatible architecture of the present disclosure is the memory array itself. As with first architecture of FIG. 4B these are the individual array cells (CELLx0-CELLx3 in FIG. 6B) themselves, each comprising a resistive change element (SWx0-SWx3, in FIG. 6B) and a selection element (FETs Tx0-Tx3, in FIG. 6B). Each of these cells is addressable responsive to an array of word lines, a pair bit lines (for each row), and a select line (for each array row) as described in detail above with respect to FIG. 4B.

Section 612 within this second DDR compatible architecture contains the reference resistors (identical to section 412 in FIG. 4B). Section 620 within this second DDR compatible architecture provides equilibration and isolation devices. Section 630 within this second DDR compatible architecture is a sense amplifier/latch. And bi-directional data bus control circuit 640 within this second DDR compatible architecture is a data bus bi-directional control. As with the memory array section 610, the structure and function of these sections is identical to those of their counterparts detailed in FIG. 4B and are described in detail within the discussion of FIG. 4B above.

Section 615 (the write select controls) and section 625 (the voltage shifter) of FIG. 6B provide a voltage shifting function during WRITE operations within the second DDR compatible architecture. This voltage shifting function (described further above) will be described in more detail with respect to FIG. 7 and FIG. 8 and allows the sense amplifier/latch 630 and the bi-directional data bus control circuit 640 to operate at $V_{DD}$ (the relatively lower system level voltage, as described with respect to FIG. 5B above) and restricts exposure to the relatively higher programming voltages ("$V_{HI}$" as listed FIG. 6A) to the memory array itself, section 610, and to sections 615 and 625 providing these relatively high voltages. In this way, the need for larger and high voltage rated components for the entire data path during a WRITE operation, as would be required within certain applications using the first DDR compatible architecture of FIG. 4B, is significantly reduced, allowing for more desirable design parameters (in terms of scaling and cost, for example) within such applications.

As shown in FIG. 6A, during a READ operation using the second DDR compatible architecture of the present disclosure, section 615 (the write select controls) and section 625 (the voltage shifter) are disabled. As such, during READ operations the second DDR compatible architecture is essentially identical to the first DDR compatible architecture, and the READ operation is identical to that shown within the waveform diagrams of FIG. 5A. As such, the discussion of the READ operation detailed in FIG. 5A above is also illustrative of a READ operation performed on the second DDR compatible architecture as shown in FIG. 6B. As described above, however, these new sections (615 and 625) provide a voltage shifting function and memory array 610 voltage and current drive function during a WRITE operation by providing a $V_{DD} \times 2$ voltage to memory array 610 bit lines. This voltage shifting and drive function is illustrated in the exemplary WRITE operation detailed in FIG. 7.

Figure 7:
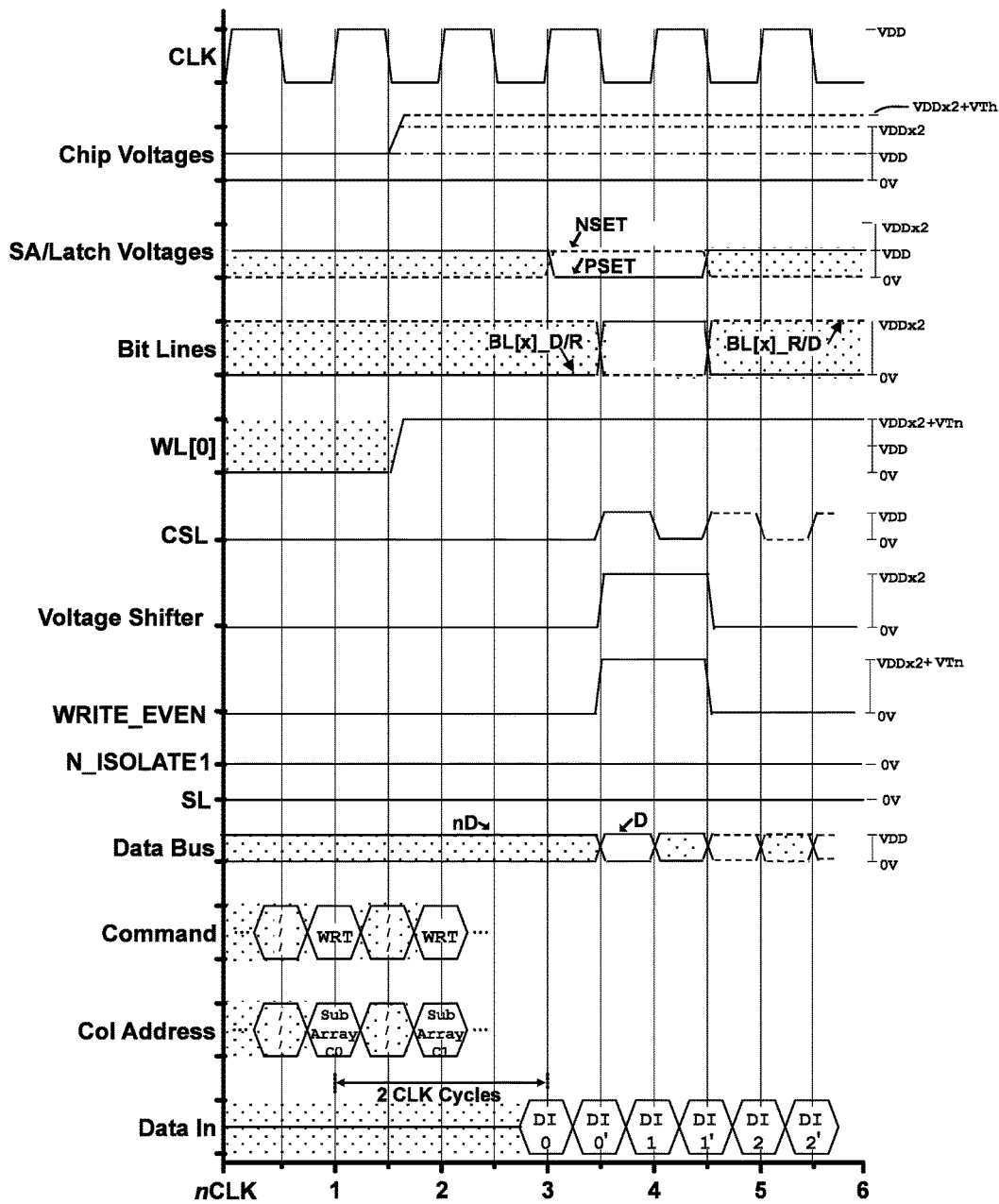
FIG. 7 is a waveform timing diagram illustrating an exemplary WRITE operation performed on a cell within the second DDR compatible NRAM array architecture detailed in FIG. 6B.

Referring now to timing diagram 700 illustrated in FIG. 7, a clock (CLK) signal synchronizes the memory's digital interfaces to an external controller or processor (as was described with in FIG. 5B). As with the exemplary WRITE operation on the first DDR compatible architecture of FIG. 5B, throughout the first clock cycle (between "clock 0" and "clock 1") in FIG. 7, the array voltages (represented by the "Chip Voltages" waveform) remain at $V_{DD}$. Select line SL voltage remains low (ground for example) during the entire WRITE cycle. $V_{DD}$ is typically, but not limited to, a voltage of approximately 1 Volt. The row address has been activated and word line WL[0] has been selected in this example prior to the start of the first clock CLK cycle (not shown in FIG. 7). The column address clock generator is activated (FIG. 10) by WRITE "command" WRT. The "Col Address" is received and is stored in column address buffer (FIG. 10). Column address C0 is selected at the beginning of the WRITE cycle. There is an on chip latency (delay) of 2 CLK cycles in this example before external data is received by the data I/O Buffer/Driver 1067 (FIG. 10). Sense amplifier/latches, such as sense amplifier/latch 630 (FIG. 6B), are inactive with PSET voltage high and NSET voltage low. However, unlike timing diagram 550 shown in FIG. 5B, in timing diagram 700 (FIG. 6B) N_ISOLATE1 remains low during the entire WRITE cycle so as to isolate sense amplifier/latch 630 from the relatively high voltages applied to bit lines of memory array 610 as explained further above.

Referring to timing diagram 700 (FIG. 7), at the start of the second clock cycle (between CLK1 and CLK2) the column address clock generator is activated (FIG. 10) by WRITE "command" WRT and "Col Address" C1 is selected, which is essentially the same timing described above with respect to timing diagram 550 shown in FIG. 5B. In support of the WRITE operation, on-chip voltage generators provide SET voltage $V_{SET}$ in excess of $V_{DD}$, in this example, $V_{SET} = V_{DD} \times 2$, and SET overdrive voltage $V_{DD} \times 2 + V_{TH}$ using known on-chip voltage generation methods. So for example, if $V_{DD} = 1$ V, $V_{SET} = 2$ V. The selected word line WL[0] in this example, illustrated in memory array 610 (FIG. 6B), transitions to $V_{DD} \times 2 + V_{TH}$ to enable the full SET voltage $V_{DD} \times 2$ and WRITE current to nonvolatile storage element SWx0. However, as described above with respect to FIG. 5B, it should be understood that in some cases it may be desirable to limit the SET current flowing into corresponding nonvolatile storage element SWx0 by operating FET Tx0 in a saturation mode.

Referring to FIG. 7, at the start of the third clock cycle (between CLK2 and CLK3) "Command" and "Col Address" are activated in this and each of the subsequent cycles as described with respect to cycles 1 and 2 above. "Data in" begins with data input DI0 from the 4-bit external data bus, which is latched by the data I/O buffer/driver 1067 (FIG. 10) by the end of cycle 3, during the positive transition of clock "CLK". The incoming data pulses on the external 4-bit data bus transition between 0 and $V_{DD}$ voltages for both rising and falling transitions of the clock CLK. These external data pulses are received and temporarily latched by the data I/O buffer/driver 1067 in two groups of 4 bits. Data I/O buffer/driver 1067 then transmits data waveforms corresponding to 8 bits over the bidirectional internal data bus, switching between $V_{DD}$ and zero volts, to bi-directional data bus control circuit 640 (FIG. 6B) at each positive transition of clock CLK, where D and nD also transition in a voltage range of $V_{DD}$ as shown in timing diagram 700 (FIG. 7).

Continuing with the third clock cycle timing description, sense amplifier/latches are activated by "SA/Latch voltages" at the end of cycle 3. PSET transitions from $V_{DD}$ to ground thereby connecting FET TSA5 to sense amplifier/latch 630 voltage $V_{SA} = V_{DD}$ as shown in FIG. 6B. NSET transitions from zero to $V_{DD}$ voltage thereby connecting FET TSA6 to a low voltage (ground). "SA/Latch voltages" shows one of the eight sense amplifiers activated during the first WRITE cycle. Since in this page mode example, there are 256 WRITE cycles needed to write all the bits along word line WL[0], the sense amplifier/latch remains activated long enough to latch and temporarily hold a data bit until completion of the first WRITE cycle. It is then deactivated until after another 255 WRITE cycles are completed in order to save power. It is reactivated (not shown) when a new word line is selected by a row decoder (FIG. 10), the column decoder (FIG. 10) selects the eight sense amplifiers again, and the next WRITE cycle begins. "N-ISOLATE1" remains deactivated during the entire second DDR compatible architecture, as shown in timing diagram 700, to isolate sense amplifier/latch 630 from the relatively high WRITE voltage applied to bit lines of memory array 610 as explained further above.

Referring to FIG. 7, at the start of the fourth clock cycle, (between CLK3 and CLK4), "Data in" continues with data input DI0' from the 4-bit external data bus, which is latched by the data I/O buffer/driver 1067 (FIG. 10) in mid-clock cycle 4, during a negative transition of clock "CLK". At this point in the cycle, the 8 bits represented by DI0 and DI0' are available from the data I/O buffer/driver 1067 on the 8-bit bidirectional "Data Bus". "CSL" activates bi-directional data bus control circuit 640 (FIG. 6B) connecting the 8-bit on-chip data bus to each of eight sense amplifier/latches, such as sense amplifier/latch 630, that latch and temporarily hold the data. In this example, the data bus input to be written into memory array 610 is shown in timing diagram 700 as "D". In the second DDR compatible architecture, voltage shifter 625 is activated as $V_{HI}$ transitions from a low voltage to the WRITE SET voltage $V_{DD} \times 2$. As explained further below with respect to FIG. 8, sense amplifier/latch 630 terminals x1 and x2 voltages are in the range of zero to $V_{DD}$ volts. Voltage shifter 625 output voltage $O_{VS}$ switches from zero to $V_{DD} \times 2$. In this example, since an even word line WL[0] was selected, write select 615 circuit FET $T_{WR\_E}$ is activated when WRITE_EVEN transitions to $V_{DD} \times 2 + V_{TH}$ and output voltage $O_{VS}$ drives bit line BL[x]_D/R to $V_{SET} = V_{DD} \times 2$ and sets nonvolatile storage element SWx0 to a low resistance value corresponding to a logic "1" state. If the input data had been a logic "0", the sense amplifier would have been in the opposite state and voltage shifter 625 output voltage $O_{VS}$ would have been a low voltage, essentially zero volts, leaving nonvolatile storage element SWx0 in its pre-set high resistance RESET state. It should be noted that if an odd numbered word line were selected, WRITE_ODD would be enabled instead of WRITE_EVEN, and the programming voltage ($O_{VS}$) would be instead driven onto BL[x]_R/D. The combination of voltage shifter 625 and write select 615 bypass isolation and equilibration 620 circuit to perform a WRITE operation, since a low N_ISOLATE1 voltage keeps isolation and equilibration 620 circuit inactive as explained further above.

Referring to FIG. 7, during the fifth clock cycle (between CLK4 and CLK5), bit line BL[x]_D/R SET cycle is completed. "SA/Latch voltages" deactivate the corresponding sense amplifier/latch. Voltage shifter 625 is turned off by disconnecting $V_{HI}$ from chip voltage $V_{DD} \times 2$ and write select 615 is deactivated by WRITE_EVEN. Word line WL[0] remains active until all bits along the word line are written, which in this page mode example, requires a total of 256 cycles. The next 4-bit DI1 data inputs are received from the external data bus during a positive transition of the clock CLK, then 4-bit DDI1' data inputs are received during the negative transition of the clock CLK. The 8 bits are temporarily latched by data I/O buffer/driver 1067 (FIG. 10) and transmitted to the 8-bit on-chip data bus. CSL is activated and the eight data bits are routed to another 8 sense amplifier/latches corresponding to another column address decoded by the column decoder (FIG. 10). Another 8 bits are written along selected word line WL[0] but at other cells and corresponding storage element locations in memory array 610 (FIG. 6B). The activation of these other sense amplifier/latches and turning on of the activation devices is similar to those illustrated in timing diagram 700 except that they occur during later clock cycles. The 8-bit data WRITE operation is repeated again with input data DI2 and DI2' in cycle 6 (cycle 5 to cycle 6), and so on, until all bits along selected word line WL[0] are written. In this page mode example, 2048 bits are written along word line WL[0] in 256 cycles. The DDR page mode WRITE operation then continues with a new word line when WL[0] is deactivated, and another word line, WL[1] for example, selected by the row decoder is activated. The waveforms shown in timing diagram 700 are repeated until all bits in the page have been written.

The second DDR compatible architecture performed essentially the same WRITE function (table 601, schematic 602, and timing diagram 700 illustrated in FIGS. 6A, 6B, and 7, respectively) as the first DDR compatible architecture (table 401, schematic 402, and timing diagram 550 illustrated in FIGS. 4A, 4B, and 5B). However, the second DDR compatible architecture used the relatively low operating voltage $V_{DD}$ (approximately 1 V in this example) in the entire data path including the sense amplifier/latch, digital data interface, on-chip data bus, and data I/O buffer/driver 1067. The higher WRITE voltage of $V_{DD} \times 2$ was only used to drive bit lines. Since the first DDR compatible architecture used the relatively high $V_{DD} \times 2$ voltage in the entire data path, the second architecture needs far fewer larger and high voltage rated components for the entire data path and significantly reduces power dissipation with lower voltage swings, resulting more desirable (favorable) design parameters in terms of scaling and cost, for example, within such applications as described further above.

Figure 8B:
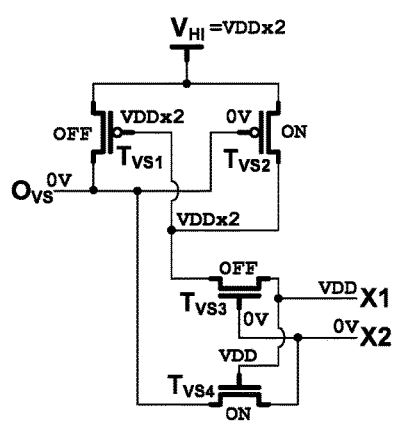
Figure 8C:
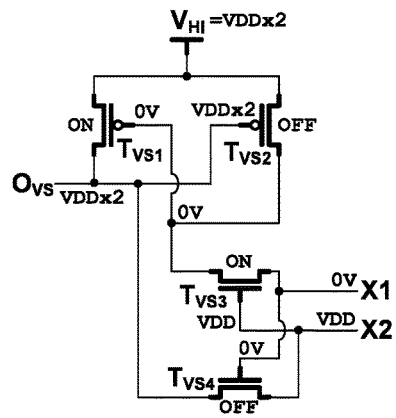

FIGS. 8A-8C illustrate the function of the voltage shifter 625 shown in FIG. 6B and used within the exemplary WRITE operation on the second DDR compatible resistive change element array as detailed in FIG. 7. FIG. 8A shows the voltage shifter circuit 801 isolated from the array circuit for the sake of clarity with input nodes X1 and X2 connected to sense amplifier/latch 630. FIG. 8B shows a first state 802 of node voltages within voltage shifter circuit 801 when input node X1 is at voltage $V_{DD}$ and input node X2 is at 0 V, resulting in an output voltage $O_{VS} = 0$ V. And FIG. 8C shows a second state 803 within voltage shifter circuit 801 when input node X1 is at 0 volts and input node X2 is at voltage $V_{DD}$, resulting in an output voltage $O_{VS} = V_{DD} \times 2$.

Looking now to FIG. 8A, PFET devices $T_{VS1}$ and $T_{VS2}$ have source terminals that are connected together and pulled up to $V_{HI}$, which represents a required programming voltage (as described above with respect to FIGS. 6B and 7). As with the exemplary WRITE operation of FIG. 7, within FIGS. 8B and 8C this programming voltage is imagined to be $V_{DD} \times 2$, or twice the voltage level of the digital circuitry driving the array. The drain of $T_{VS1}$ is connected to the drain of NFET device $T_{VS4}$ and the gate of $T_{VS2}$ at node $O_{VS}$. The drain of $T_{VS2}$ is connected to the drain of NFET $T_{VS3}$ and the gate of $T_{VS1}$. The source of $T_{VS3}$ is connected to the gate of $T_{VS4}$ and to terminal X1 connected to sense amplifier/latch 630. The source of $T_{VS4}$ is connected to the gate of $T_{VS3}$ and to terminal X2 also connected to sense amplifier/latch 630.

As shown in FIG. 8B, when $V_{DD}$ is applied to X1 and 0V is applied to X2 (which would represent a logic '0' temporarily stored in sense amplifier/latch 630), $T_{VS2}$ and $T_{VS4}$ are turned on, and $T_{VS1}$ and $T_{VS3}$ are turned off. This results in 0V at node $O_{VS}$, essentially no programming voltage or current driven onto the bit line. However, as shown in FIG. 8C, when 0V is applied to X1 and $V_{DD}$ is applied to X2 (which would represent a logic '1' temporarily stored in sense amplifier/latch 630), $T_{VS1}$ and $T_{VS3}$ are turned on, and $T_{VS2}$ and $T_{VS4}$ are turned off. Referring now FIG. 6B circuits bi-directional data bus control 640, sense amplifier/latch 630, and voltage shifter 625, when terminal D is at $V_{DD}$ and terminal nD is at zero Volts, corresponding to a logic "1", then sense amplifier/latch terminals X1=0 and X2=$V_{DD}$. This results in $V_{HI}$ (the required programming voltage $V_{DD} \times 2$ in this example) being driven out at node $O_{VS}$.

Figure 9:
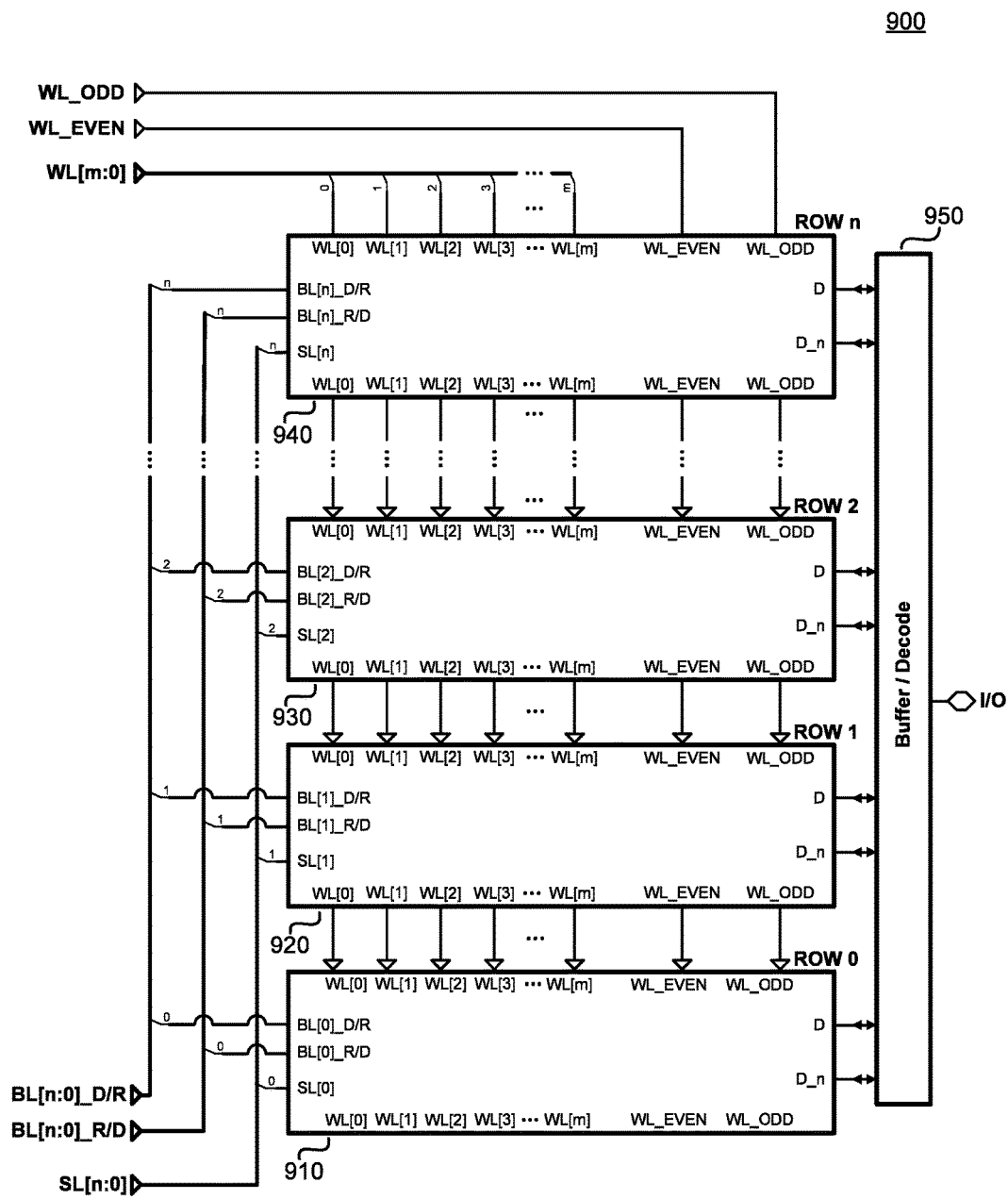
FIG. 9 is a simplified block diagram illustrating the array structure of DDR compatible NRAM architectures of the present disclosure.

Referring now to FIG. 9, a simplified block diagram of a resistive change element memory array 900 and is used to illustrate how the simplified array row schematics 402 and 602 of FIGS. 4B and 6B, respectively, are used within a full memory array. The memory array 900 is comprised of "n+1" rows, with each row containing "m+1" memory cells. Or thought of another way, resistive change memory array 900 comprises an array of resistive change memory elements arranged in a grid of "n+1" rows and "m+1" columns. As described above, the simplified schematics of FIGS. 4B and 6B each showed a representative single row (row "x") of the first and second, respectively, DDR compatible resistive change element architectures of the present disclosure.

Each of the rows (ROW 0, ROW1, ROW 3, and ROW n) in resistive change memory array 900 is represented by a block (910, 920, 930, and 940, respectively). Each of these simplified blocks (910-940) is representative of either the simplified array row schematic 402 illustrated in FIG. 4B or the simplified array row schematic 602 illustrated in FIG. 6B and discussed in detail with respect to the waveform diagrams 550 shown in FIG. 5B and 700 shown in FIG. 7, respectively. The isolation controls (N_ISOLATE1, N_ISOLATE2, and EQ in FIGS. 4B and 6B), the sense amplifier/latch controls (NSET and PSET in FIGS. 4B and 6B), the output controls (CSL in FIGS. 4B and 6B), and the write select controls (WRITE_EVEN and WRITE_ODD in FIG. 6B) are not shown within FIG. 9 for the sake of clarity. However all rows (910-940) can be thought to be responsive to these control signals.

As can be seen in FIG. 9, an array of "n+1" pairs of bit lines (BL[n:0]_D/R and BL[n:0]_R/D) is used to provide each row (910-940) within the resistive change memory array 900 with a pair of dedicated folded bit lines. BL[n:0]_D/R is analogous to BL[x]_D/R in FIGS. 4B and 6B, and BL[n:0]_R/D is analogous to BL[x]_R/D in FIGS. 4B and 6B. An array of select lines (SL[n:0]) is used to provide each row (910-940) within the resistive change memory array 900 with a select line (analogous to SL[x] in FIGS. 4B and 6B). An array of "m+1" word lines (WL[m:0]) is common to all rows (910-940) within the array, and each of the "m+1" resistive change memory cells within each array row (910-940) is responsive to one of these word lines. WL[m:0] is analogous to WL[3:0] in FIGS. 4B and 6B. WL_ODD and WL_EVEN are control signals also common to all rows (910-940) within the memory array 900. As described in detail within the discussion of FIGS. 4B, 5A, and 6B, each array row (910-940) with memory array 900 includes two reference elements. Within each array row (910-940), each of these reference elements is responsive to either WL_ODD or WL_EVEN as detailed in the discussion of FIGS. 4B, 5A, and 6B above.

A buffer/decoder element 950 is used to connect with the data lines (D and nD in FIGS. 4B and 6B) of each of the array rows (910-940) and arrange these data signals into a data input/output (I/O) interface. In this way, the data lines from each row can be selected and processed as befits the needs of the interface for particular application using a specific external control circuitry element (such as, but not limited to, a microprocessor or an FPGA).

Figure 10:
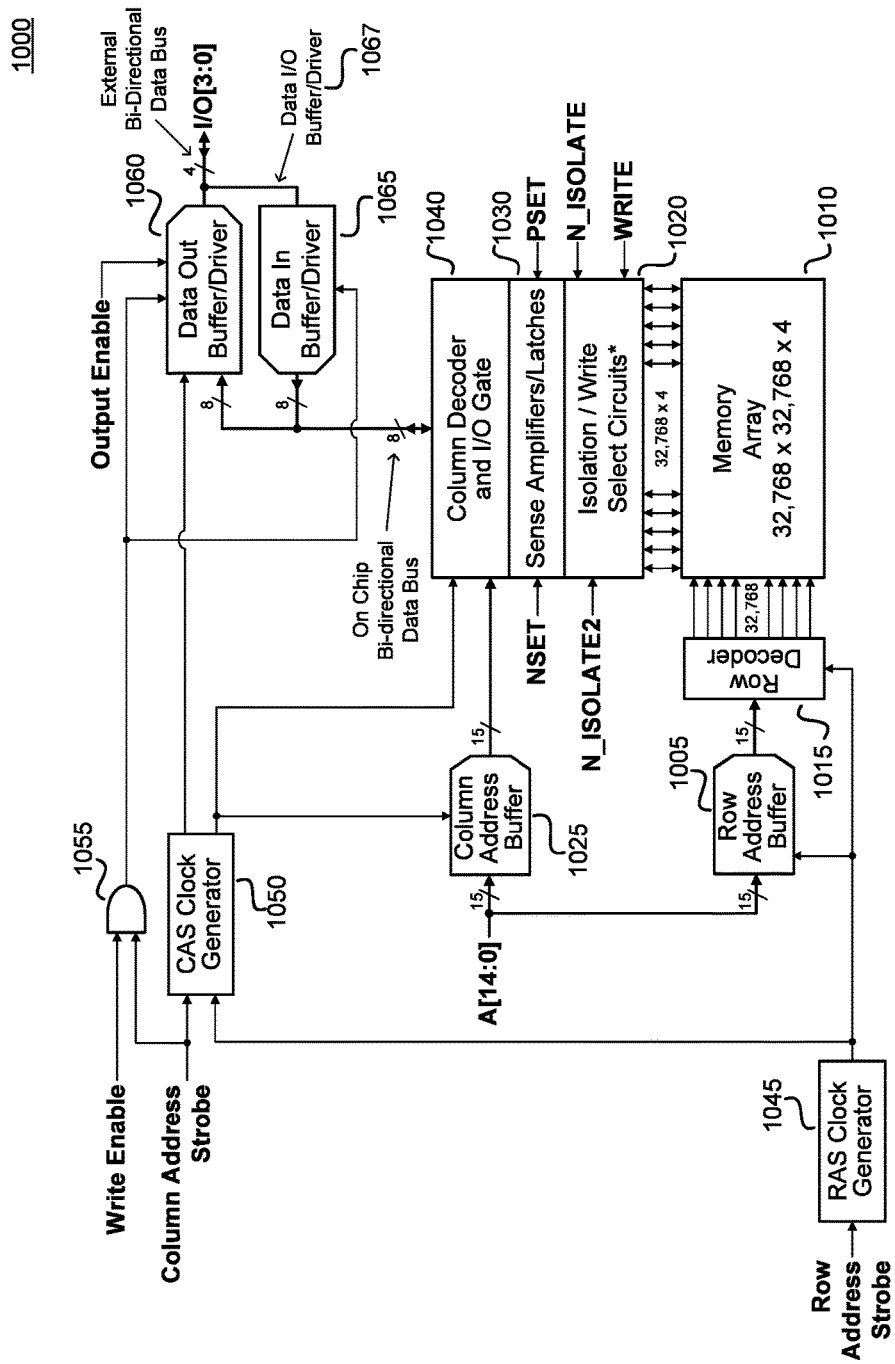
FIG. 10 is system level block diagram illustrating an exemplary 1 Gb×4 DDR compatible architecture for a resistive change memory array according to the methods of the present disclosure.

Referring now to FIG. 10, a system level block diagram illustrating an exemplary 1 Gb×4 resistive change memory 1000 suitable for use with the first and second DDR compatible resistive change array architectures of the present disclosure is shown.

At the core of the resistive change memory 1000 (FIG. 10), a four Gigabit Memory Array element 1010 is architected in a 32,768×32,768×4 configuration. Memory Array element 1010 is coupled to an array of Sense Amplifiers 1030 through an array of Isolation Devices 1020. The Isolation/Write Select Circuits 1020 are responsive to a pair of isolation control signals (N_ISOLATE1 and N_ISOLATE2) or a pair of write select control signals (WRITE_EVEN and WRITE_ODD). For a first DDR architecture, isolation circuit control signal N_ISOLATE is used. However, for a second DDR architecture, isolation circuit control signal N_ISOLATE is used for READ and write select control signal WRITE is used during WRITE operations. The Sense Amplifiers 1030, responsive to control signals NSET and PSET, temporally store and provide array data to the I/O Gate block 1040. Referring back to the simplified array row schematics 402 of FIG. 4B and 602 of FIG. 6B, Memory Array element 1010 is analogous to elements 410 and 610; the Isolation/Write select circuits 1020 are analogous to elements 420, 620, and 615; the Sense Amplifier/Latch circuits 1030 are analogous to elements 430 and 630; and the I/O Gate block 1040 is analogous to element bi-directional data bus control circuit 440 and 640.

The Data Out Buffer/Decoder 1060 and the Data In Buffer/Decoder 1065, comprising data I/O buffer/driver 1067, are analogous to element 950 in FIG. 9, and provide interface control between the memory 1000 and an external control circuitry element (such as, but not limited to, a microprocessor, a microcontroller, or an FPGA).

Responsive to the Row Address Strobe control signal, RAS Clock Generator 1045 provides a timing signal to Row Address Buffer 1005 and Row Decoder 1015, which, responsive to the address bus (A[14:0]) generate the row array lines required for addressing memory array 1010. Responsive to a Column Address Strobe control signal, CAS Clock Generator 1050 provides a timing signal to Column Address Buffer 1025, which, responsive to the address bus (A[14:0]), generates the column array lines required for addressing memory array 1010. A Write Enable control signal is ANDed with the Column Address Strobe control signal to provide a timing control to Data Out Buffer/Decoder 1060 and Data In Buffer/Decoder 1065 comprising data I/O buffer/driver 1067.

Although not shown in FIG. 7 (for the sake of clarity), external control circuit elements (such as, but not limited to, a microprocessor, a microcontroller, or an FPGA) are used to apply the different control signals and manage the timing of those control signal as described above and within FIGS. 4A, 4B, 5A, 5B, 6A, 6B, and 7 with respect to the resistive change memory architecture of the present disclosure. The READ operations, for example, detailed in FIG. 5A (and described above) and the WRITE operations detailed in FIGS. 5B and 7 (and described above) can be implemented through a variety of structures as best fits the needs of a specific application. For example, FPGAs, PLDs, microcontrollers, logic circuits, or a software program executing on a computer could all be used to execute the programming operations algorithms detailed in FIGS. 5A, 5B, and 7 and provide the necessary control and selection signals discussed above. In this way, the individual resistive change memory cells with the Memory Array element 1010 in FIG. 10, for example, can be independently selected and programmed or read back (as described above) as is needed for a specific application.

It should be noted that though the resistive change memory array architectures of the present disclosure are presented using the exemplary simplified schematics within FIGS. 4B and 6B and the block diagrams of FIGS. 9 and 10, the methods of the present disclosure should not be limited to those specific electrical circuits depicted. Indeed, it will be clear to those skilled in the art that the electrical circuits depicted in FIGS. 4B, 6B, 9, and 10 can be altered in a plurality of ways to optimize a circuit to practice the described advance architectures within a specific application.

It is preferred, then, that the preceding description of resistive change memory array architectures be representative and inclusive of these variations and not otherwise limited to the specific illustrative parameters detailed.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of reading the informational state of a resistive change element, said method comprising:
   providing a resistive change element, wherein said resistive change element is capable of being switched between at least two non-volatile resistance values with a first resistance value corresponding to a first informational state and a second resistance value corresponding to a second informational state;

providing a resistive reference element, wherein said resistive reference element has an electrical resistance selected to fall between said first resistance value and said second resistance value;

discharging a voltage through both said resistive change element and said resistive reference element; and comparing the rate of discharge through said resistive change element to the rate of discharge through said resistive reference element;

wherein a greater rate of discharge through said resistive change element corresponds to a first informational state being stored within said resistive change element and a greater rate of discharge through said resistive reference element corresponds to a second informational state being stored within said resistive change element.

2. The method of claim 1 wherein said resistive change elements are two-terminal nanotube switching elements.

3. The method of claim 2 wherein said two-terminal nanotube switching elements comprise a nanotube fabric.

4. The method of claim 1 wherein said resistive change elements are metal oxide memory elements.

5. The method of claim 1 wherein said resistive change elements are phase change memory elements.

6. The method of claim 1 wherein said sense amplifiers transmit the informational state of multiple bit lines to data I/O buffer/drivers via bi-directional data bus control circuits coupled to a multi-bit bi-directional on-chip data bus.

7. The method of claim 6 wherein the informational state of multiple bit lines is transmitted to the multi-bit bi-directional on-chip data bus as electrical pulses synchronized to system clock transitions.

8. The method of claim 7 in which the synchronized electrical pulses are received by data I/O buffer/drivers and transmitted as synchronized electrical pulses to an external data bus at a two times or greater rate.

9. The method of claim 6 in which the on-chip data bus has at least two times the number of data bus lines as the number of data lines in the external data bus.

10. The method of claim 7 wherein the electrical pulse amplitudes transition between a low voltage level, such as ground, and a high voltage level corresponding to the logic operating voltages.

11. The method of claim 1 wherein said reading methods is a compatible with the timing requirements of a double data rate (DDR) memory architecture.

12. A method of programming the informational state of a resistive change element, said method comprising:

providing a resistive change element, wherein said resistive change element is capable of being switched between at least two non-volatile resistance values with a first resistance value corresponding to a first informational state and a second resistance value corresponding to a second informational state;

receiving data input pulses from an external data bus to a data I/O buffer/driver circuit at an input data rate and system level logic voltage amplitudes, wherein said I/O buffer driver circuit converts said input pulses into programming pulses and provides said programming pulses to an on-chip data bus, said programming pulses having at a data rate of no more than half said input data rate and programming level voltage amplitudes;

wherein said on-chip data bus provides said programming data pulses to sense amplifiers via bi-directional data bus control circuits, each of said sense amplifiers transmitting programming pulses to at least one bit line electrically coupled to said resistive change element by a cell select device;

wherein a programming voltage pulse having a programming voltage level corresponding to a first informational state is stored within said resistive change element and a programming voltage pulse having a programming level corresponding to a second informational state is stored within said resistive change element.

13. The method of claim 12 wherein said programming voltage pulses are generated by a voltage switching circuit.

14. The method of claim 12 wherein said on-chip data bus has more data lines than said external data bus.

15. The method of claim 12 wherein said resistive change elements are two-terminal nanotube switching elements.

16. The method of claim 15 wherein said two-terminal nanotube switching elements comprise a nanotube fabric.

17. The method of claim 12 wherein said resistive change elements are metal oxide memory elements.

18. The method of claim 12 wherein said resistive change elements are phase change memory elements.

19. A method of programming the informational state of a resistive change element, said method comprising:

providing a resistive change element, wherein said resistive change element is capable of being switched between at least two non-volatile resistance values with a first resistance value corresponding to a first informational state and a second resistance value corresponding to a second informational state;

receiving data input pulses from an external data bus to a data I/O buffer/driver circuit at an input data rate and logic operation voltage amplitudes, wherein said I/O buffer driver circuit converts said input pulses into programming pulses and provides said programming pulses to an on-chip data bus, said programming pulses having at a data rate of no more than half said input data rate and logic operation voltage amplitudes;

wherein said on-chip data bus provides said programming data pulses to sense amplifiers via bi-directional data bus control circuits, each of said sense amplifiers transmitting programming pulses to at least one input terminal of a voltage shifting element having at least one output coupled through a select circuit to at least one bit line electrically coupled to said resistive change element by a cell select device;

wherein a programming voltage pulse having a programming voltage level corresponding to a first informational state is stored within said resistive change element and a programming voltage pulse having a programming level corresponding to a second informational state is stored within said resistive change element.

20. The method of claim 19 wherein said on-chip data bus has more data lines than said external data bus.

21. The method of claim 19 wherein said resistive change elements are two-terminal nanotube switching elements.

22. The method of claim 21 wherein said two-terminal nanotube switching elements comprise a nanotube fabric.

23. The method of claim 19 wherein said resistive change elements are metal oxide memory elements.

24. The method of claim 19 wherein said resistive change elements are phase change memory element.

\* \* \* \* \*